United States Patent [19]

Houk et al.

[11] Patent Number: 4,996,527
[45] Date of Patent: Feb. 26, 1991

[54] PIPELINED RESIDUE TO MIXED BASE CONVERTER AND BASE EXTENSION PROCESSOR

[75] Inventors: Theodore L. Houk, Seattle; R. Aaron Falk, Renton, both of Wash.

[73] Assignee: The Boeing Company, Seattle, Wash.

[21] Appl. No.: 414,019

[22] Filed: Sep. 29, 1989

[51] Int. Cl.⁵ .......................................... H03M 7/18
[52] U.S. Cl. ...................................... 341/83; 364/746
[58] Field of Search ........................... 341/83; 364/746

[56] References Cited

U.S. PATENT DOCUMENTS

| | | |
|---|---|---|
| 3,132,334 | 5/1964 | Williams . |
| 3,267,461 | 8/1966 | Harmon . |
| 4,107,783 | 8/1978 | Huang ................................. 364/746 |
| 4,281,391 | 7/1981 | Huang ................................. 364/347 |
| 4,506,151 | 3/1985 | MacDonald et al. ........... 250/213 A |
| 4,528,641 | 7/1985 | Burrows ............................. 364/757 |
| 4,567,355 | 1/1986 | Schuoecker et al. ............... 235/310 |
| 4,584,563 | 4/1986 | Bernardson .......................... 341/83 |
| 4,709,345 | 11/1987 | Vu ....................................... 364/746 |
| 4,752,904 | 6/1988 | Paul .................................... 364/739 |
| 4,770,483 | 9/1988 | Ridgway .......................... 350/96.13 |
| 4,797,843 | 1/1989 | Falk et al. ........................... 364/713 |
| 4,857,762 | 8/1989 | Gaebel ............................... 307/441 |
| 4,910,699 | 3/1990 | Capps et al. ....................... 364/746 |

FOREIGN PATENT DOCUMENTS 1429323 10/1988 U.S.S.R. ................................ 341/83

OTHER PUBLICATIONS

Demetri Psaltis and David Casasent, "Optical Residue Arithmetic: A Correlation Approach", Applied Optics, vol. 18, No. 2, Jan. 15, 1979, pp. 163-171.
"Annual Meeting Optical Society of America Technical Digest", Optical Society of America, Oct. 18-23, 1987.
Szabo, Nicholas S., M.S., "Residue Arithmetic and Its Applications to Computer Technology", McGraw-Hill Book Company, pp. 34-51.
Taylor, Fred J., "Residue Arithmetic: A Tutorial with Examples", Computer, vol. 17, No. 5, pp. 50-62 (May 1984).
Huang et al., "Optical Computation Using Residual Arithmetic", Applied Optics, vol. 18, No. 2, pp. 149-162 (Jan. 15, 1979).

*Primary Examiner*—William M. Shoop, Jr.
*Assistant Examiner*—Nancy Le
*Attorney, Agent, or Firm*—Foley & Lardner, Schwartz, Jeffery, Schwaab, Mack, Blumenthal & Evans

[57] ABSTRACT

An information processor receives a residue number as an input and generates a mixed base number correspopnding to the residue number and a redundant residue digit corresponding to the residue number. The information processor includes a plurality of optical arithmetic and logic units (OALUs) arranged in channels and stages. Each digit of the residue number corresponds to a channel. Each channel produces a mixed base digit associated with the residue input number. The stages are serially arranged to successively generate mixed base digits corresponding to the residue number by performing modular multiplication and modular subtraction. Delay circuits are arranged parallel to the plurality of OALUs such that all of the mixed base digits are transmitted from the information processor at the same time. An additional channel of OALUs calculates the redundant residue digit based on the mixed base digits.

20 Claims, 20 Drawing Sheets

FIG. 1

| DECIMAL NUMBER | RESIDUE NUMBER | | | MIXED BASE NUMBER | | |
|---|---|---|---|---|---|---|
| | r3 ($m_3=5$) | r2 ($m_2=3$) | r1 ($m_1=2$) | a3 ($w_3=6$) | a2 ($w_2=2$) | a1 ($w_1=1$) |
| 0 | 0 | 0 | 0 | 0 | 0 | 0 |
| 1 | 1 | 1 | 1 | 0 | 0 | 1 |
| 2 | 2 | 2 | 0 | 0 | 1 | 0 |
| 3 | 3 | 0 | 1 | 0 | 1 | 1 |
| 4 | 4 | 1 | 0 | 0 | 2 | 0 |
| 5 | 0 | 2 | 1 | 0 | 2 | 1 |
| 6 | 1 | 0 | 0 | 1 | 0 | 0 |
| 7 | 2 | 1 | 1 | 1 | 0 | 1 |
| 8 | 3 | 2 | 0 | 1 | 1 | 0 |
| 9 | 4 | 0 | 1 | 1 | 1 | 1 |
| 10 | 0 | 1 | 0 | 1 | 2 | 0 |
| 11 | 1 | 2 | 1 | 1 | 2 | 1 |
| 12 | 2 | 0 | 0 | 2 | 0 | 0 |
| 13 | 3 | 1 | 1 | 2 | 0 | 1 |
| 14 | 4 | 2 | 0 | 2 | 1 | 0 |
| 15 | 0 | 0 | 1 | 2 | 1 | 1 |
| 16 | 1 | 1 | 0 | 2 | 2 | 0 |
| 17 | 2 | 2 | 1 | 2 | 2 | 1 |
| 18 | 3 | 0 | 0 | 3 | 0 | 0 |
| 19 | 4 | 1 | 1 | 3 | 0 | 1 |
| 20 | 0 | 2 | 0 | 3 | 1 | 0 |
| 21 | 1 | 0 | 1 | 3 | 1 | 1 |
| 22 | 2 | 1 | 0 | 3 | 2 | 0 |
| 23 | 3 | 2 | 1 | 3 | 2 | 1 |
| 24 | 4 | 0 | 0 | 4 | 0 | 0 |
| 25 | 0 | 1 | 1 | 4 | 0 | 1 |
| 26 | 1 | 2 | 0 | 4 | 1 | 0 |
| 27 | 2 | 0 | 1 | 4 | 1 | 1 |
| 28 | 3 | 1 | 0 | 4 | 2 | 0 |
| 29 | 4 | 2 | 1 | 4 | 2 | 1 |

```
        3        0        0    DECIMAL NUMBER 18
+       4        1        1    DECIMAL NUMBER 19
    ─────────────────────────
    7 MOD 5  1 MOD 3  1 MOD 2
        2        1        1
```

| b | a | a·b | $|a \cdot b|_{m=5}$ |
|---|---|-----|---------------------|
| 1 | 1 | 1   | 1 |
| 2 | 3 | 6   | 1 |
| 3 | 2 | 6   | 1 |
| 4 | 4 | 16  | 1 |

FIG. 5

$m_1=3 \quad m_2=5 \quad m_3=2$
$r_1=1 \quad r_2=4 \quad r_3=1$

1    $X = a_3 m_1 m_2 + a_2 m_1 + a_1$

2a    $|X|m_1 = |a_1|m_1 = a_1 =$      $\boxed{1 = a_1}$

2b    $|X|m_2 = |a_2 m_1|m_2 + |a_1|m_2 =$      4

2c    $|X|m_3 = |a_3 m_1 m_2|m_3 + |a_2 m_1|m_3 + |a_1|m_3 =$      1

3a    $|a_1|m_1 =$      1

3b    $|a_1|m_2 =$      1

3c    $|a_1|m_3 =$      1

4a    $|X-a_1|m_1 =$      0

4b    $|X-a_1|m_2 = |a_2 m_1|m_2 =$      3

4c    $|X-a_1|m_3 = |a_3 m_1 m_2|m_3 + |a_2 m_1|m_3 =$      0

5a    $\left|\dfrac{1}{m_1}\right| m_2 =$      2

5b    $\left|\dfrac{1}{m_1}\right| m_3 =$      1

6a    $\left|\dfrac{1}{m_1}(X-a_1)\right| m_2 = |a_2|m_2 = a_2 =$      $\boxed{1 = a_2}$ 6b    $\left|\dfrac{1}{m_1}(X-a_1)\right| m_3 = |a_3 m_2|m_3 + |a_2|m_3 =$      0

7a    $|a_2|m_2 =$      1

7b    $|a_2|m_3 =$      1

8a    $\left|\dfrac{1}{m_1}(X-a_1-a_2)\right| m_2 =$      0

8b    $\left|\dfrac{1}{m_1}(X-a_1-a_2)\right| m_3 = |a_3 m_2|m_3 =$      1

9    $\left|\dfrac{1}{m_2}\right| m_3 =$      1

10    $\left|\dfrac{1}{m_1}\dfrac{1}{m_2}(X-a_1-a_2)\right| m_3 = |a_3|m_3 = a_3 =$      $\boxed{1 = a_3}$

FIG. 6

| DECIMAL NUMBER | RESIDUE NUMBER | | | MIXED BASE NUMBER | | |
|---|---|---|---|---|---|---|
| | $r_3$ ($m_3=5$) | $r_2$ ($m_2=3$) | $r_1$ ($m_1=2$) | $a_3$ ($w_3=6$) | $a_2$ ($w_2=2$) | $a_1$ ($w_1=1$) |
| 0 | 0 | 0 | 0 | 0 | 0 | 0 |
| 1 | 1 | 1 | 1 | 0 | 0 | 1 |
| 2 | 2 | 2 | 0 | 0 | 1 | 0 |
| 3 | 3 | 0 | 1 | 0 | 1 | 1 |
| 4 | 4 | 1 | 0 | 0 | 2 | 0 |
| 5 | 0 | 2 | 1 | 0 | 2 | 1 |
| 6 | 1 | 0 | 0 | 1 | 0 | 0 |
| 7 | 2 | 1 | 1 | 1 | 0 | 1 |
| 8 | 3 | 2 | 0 | 1 | 1 | 0 |
| 9 | 4 | 0 | 1 | 1 | 1 | 1 |
| 10 | 0 | 1 | 0 | 1 | 2 | 0 |
| 11 | 1 | 2 | 1 | 1 | 2 | 1 |
| 12 | 2 | 0 | 0 | 2 | 0 | 0 |
| 13 | 3 | 1 | 1 | 2 | 0 | 1 |
| 14 | 4 | 2 | 0 | 2 | 1 | 0 |
| -15 | 0 | 0 | 1 | 2 | 1 | 1 |
| -14 | 1 | 1 | 0 | 2 | 2 | 0 |
| -13 | 2 | 2 | 1 | 2 | 2 | 1 |
| -12 | 3 | 0 | 0 | 3 | 0 | 0 |
| -11 | 4 | 1 | 1 | 3 | 0 | 1 |
| -10 | 0 | 2 | 0 | 3 | 1 | 0 |
| -9 | 1 | 0 | 1 | 3 | 1 | 1 |
| -8 | 2 | 1 | 0 | 3 | 2 | 0 |
| -7 | 3 | 2 | 1 | 3 | 2 | 1 |
| -6 | 4 | 0 | 0 | 4 | 0 | 0 |
| -5 | 0 | 1 | 1 | 4 | 0 | 1 |
| -4 | 1 | 2 | 0 | 4 | 1 | 0 |
| -3 | 2 | 0 | 1 | 4 | 1 | 1 |
| -2 | 3 | 1 | 0 | 4 | 2 | 0 |
| -1 | 4 | 2 | 1 | 4 | 2 | 1 |

FIG. 8

| DECIMAL NUMBER | RESIDUE NUMBER | | | MIXED BASE NUMBER | | |
|---|---|---|---|---|---|---|
| | $r_3$ ($m_3=2$) | $r_2$ ($m_2=5$) | $r_1$ ($m_1=3$) | $a_3$ ($w_3=15$) | $a_2$ ($w_2=3$) | $a_1$ ($w_1=1$) |
| 0 | 0 | 0 | 0 | 0 | 0 | 0 |
| 1 | 1 | 1 | 1 | 0 | 0 | 1 |
| 2 | 0 | 2 | 2 | 0 | 0 | 0 |
| 3 | 1 | 3 | 0 | 0 | 1 | 1 |
| 4 | 0 | 4 | 1 | 0 | 1 | 0 |
| 5 | 1 | 0 | 2 | 0 | 1 | 1 |
| 6 | 0 | 1 | 0 | 0 | 2 | 0 |
| 7 | 1 | 2 | 1 | 0 | 2 | 1 |
| 8 | 0 | 3 | 2 | 0 | 2 | 0 |
| 9 | 1 | 4 | 0 | 0 | 3 | 1 |
| 10 | 0 | 0 | 1 | 0 | 3 | 0 |
| 11 | 1 | 1 | 2 | 0 | 3 | 1 |
| 12 | 0 | 2 | 0 | 0 | 4 | 0 |
| 13 | 1 | 3 | 1 | 0 | 4 | 1 |
| 14 | 0 | 4 | 2 | 0 | 4 | 0 |
| -15 | 1 | 0 | 0 | 1 | 0 | 1 |
| -14 | 0 | 1 | 1 | 1 | 0 | 0 |
| -13 | 1 | 2 | 2 | 1 | 0 | 1 |
| -12 | 0 | 3 | 0 | 1 | 1 | 0 |
| -11 | 1 | 4 | 1 | 1 | 1 | 1 |
| -10 | 0 | 0 | 2 | 1 | 1 | 0 |
| -9 | 1 | 1 | 0 | 1 | 2 | 1 |
| -8 | 0 | 2 | 1 | 1 | 2 | 0 |
| -7 | 1 | 3 | 2 | 1 | 2 | 1 |
| -6 | 0 | 4 | 0 | 1 | 3 | 0 |
| -5 | 1 | 0 | 1 | 1 | 3 | 1 |
| -4 | 0 | 1 | 2 | 1 | 3 | 0 |
| -3 | 1 | 2 | 0 | 1 | 4 | 1 |
| -2 | 0 | 3 | 1 | 1 | 4 | 0 |
| -1 | 1 | 4 | 2 | 1 | 4 | 1 |

FIG. 9

| DECIMAL NUMBER | RESIDUE NUMBER | | | | MIXED BASE NUMBER | | | |
|---|---|---|---|---|---|---|---|---|
| | $r_4$ ($m_r=7$) | $r_3$ ($m_3=5$) | $r_2$ ($m_2=3$) | $r_1$ ($m_1=2$) | $a_r$ | $a_3$ | $a_2$ | $a_1$ |
| 0 | 0 | 0 | 0 | 0 | 0 | 0 | 0 | 0 |
| 1 | 1 | 1 | 1 | 1 | 0 | 0 | 0 | 1 |
| 2 | 2 | 2 | 2 | 0 | 0 | 0 | 1 | 0 |
| 3 | 3 | 3 | 0 | 1 | 0 | 0 | 1 | 1 |
| 4 | 4 | 4 | 1 | 0 | 0 | 0 | 2 | 0 |
| 5 | 5 | 0 | 2 | 1 | 0 | 0 | 2 | 1 |
| 6 | 6 | 1 | 0 | 0 | 0 | 1 | 0 | 0 |
| 7 | 0 | 2 | 1 | 1 | 0 | 1 | 0 | 1 |
| 8 | 1 | 3 | 2 | 0 | 0 | 1 | 1 | 0 |
| 9 | 2 | 4 | 0 | 1 | 0 | 1 | 1 | 1 |
| 10 | 3 | 0 | 1 | 0 | 0 | 1 | 2 | 0 |
| 11 | 4 | 1 | 2 | 1 | 0 | 1 | 2 | 1 |
| 12 | 5 | 2 | 0 | 0 | 0 | 2 | 0 | 0 |
| 13 | 6 | 3 | 1 | 1 | 0 | 2 | 0 | 1 |
| 14 | 0 | 4 | 2 | 0 | 0 | 2 | 1 | 0 |
| 15 | 1 | 0 | 0 | 1 | 0 | 2 | 1 | 1 |
| 16 | 2 | 1 | 1 | 0 | 0 | 2 | 2 | 0 |
| 17 | 3 | 2 | 2 | 1 | 0 | 2 | 2 | 1 |
| 18 | 4 | 3 | 0 | 0 | 0 | 3 | 0 | 0 |
| 19 | 5 | 4 | 1 | 1 | 0 | 3 | 0 | 1 |
| 20 | 6 | 0 | 2 | 0 | 0 | 3 | 1 | 0 |
| 21 | 0 | 1 | 0 | 1 | 0 | 3 | 1 | 1 |
| 22 | 1 | 2 | 1 | 0 | 0 | 3 | 2 | 0 |
| 23 | 2 | 3 | 2 | 1 | 0 | 3 | 2 | 1 |
| 24 | 3 | 4 | 0 | 0 | 0 | 4 | 0 | 0 |
| 25 | 4 | 0 | 1 | 1 | 0 | 4 | 0 | 1 |
| 26 | 5 | 1 | 2 | 0 | 0 | 4 | 1 | 0 |
| 27 | 6 | 2 | 0 | 1 | 0 | 4 | 1 | 1 |
| 28 | 0 | 3 | 1 | 0 | 0 | 4 | 2 | 0 |
| 29 | 1 | 4 | 2 | 1 | 0 | 4 | 2 | 1 |
| 30 | 2 | 0 | 0 | 0 | 1 | 0 | 0 | 0 |
| 31 | 3 | 1 | 1 | 1 | 1 | 0 | 0 | 1 |
| 32 | 4 | 2 | 2 | 0 | 1 | 0 | 1 | 0 |
| 33 | 5 | 3 | 0 | 1 | 1 | 0 | 1 | 1 |
| 34 | 6 | 4 | 1 | 0 | 1 | 0 | 2 | 0 |
| 35 | 0 | 0 | 2 | 1 | 1 | 0 | 2 | 1 |
| 36 | 1 | 1 | 0 | 0 | 1 | 1 | 0 | 0 |
| 37 | 2 | 2 | 1 | 1 | 1 | 1 | 0 | 1 |
| 38 | 3 | 3 | 2 | 0 | 1 | 1 | 1 | 0 |
| 39 | 4 | 4 | 0 | 1 | 1 | 1 | 1 | 1 |
| 40 | 5 | 0 | 1 | 0 | 1 | 1 | 2 | 0 |

FIG. 10

$m_1=3 \quad m_2=5 \quad m_3=2 \quad m_4=7$
$r_1=1 \quad r_2=4 \quad r_3=1 \quad r_4=|X|_7$ 1. $X = a_4 m_1 m_2 m_3 + a_3 m_1 m_2 + a_2 m_1 + a_1$
2a. $|X|_{m_1} = |a_1|_{m_1} = a_1 = \boxed{1 = a_1}$
2b. $|X|_{m_2} = |a_2 m_1|_{m_2} + |a_1|_{m_2} = \quad 4$
2c. $|X|_{m_3} = |a_3 m_1 m_2|_{m_3} + |a_2 m_1|_{m_3} + |a_1|_{m_3} = \quad 1$
2d. $|X|_{m_4} = |a_4 m_1 m_2 m_3|_{m_4} + |a_3 m_1 m_2|_{m_4} + |a_2 m_1|_{m_4} + |a_1|_{m_4} = \quad |X|_7$
3a. $|a_1|_{m_1} = \quad 1$
3b. $|a_1|_{m_2} = \quad 1$
3c. $|a_1|_{m_3} = \quad 1$
3d. $|a_1|_{m_4} = \quad 1$
4a. $|X - a_1|_{m_1} = \quad 0$
4b. $|X - a_1|_{m_2} = |a_2 m_1|_{m_2} = \quad 3$
4c. $|X - a_1|_{m_3} = |a_3 m_1 m_2|_{m_3} + |a_2 m_1|_{m_3} = \quad 0$
4d. $|X - a_1|_{m_4} = |a_4 m_1 m_2 m_3|_{m_4} + |a_3 m_1 m_2|_{m_4} + |a_2 m_1|_{m_4} = \quad |X|_7 + 6$
5a. $\left|\tfrac{1}{m_1}\right|_{m_2} = \quad 2$
5b. $\left|\tfrac{1}{m_1}\right|_{m_3} = \quad 1$
5c. $\left|\tfrac{1}{m_1}\right|_{m_4} = \quad 5$
6a. $\left|\tfrac{1}{m_1}(X - a_1)\right|_{m_2} = |a_2|_{m_2} = a_2 = \boxed{1 = a_2}$
6b. $\left|\tfrac{1}{m_1}(X - a_1)\right|_{m_3} = |a_3 m_2|_{m_3} + |a_2|_{m_3} = \quad 0$
6c. $\left|\tfrac{1}{m_1}(X - a_1)\right|_{m_4} = |a_4 m_2 m_3|_{m_4} + |a_3 m_2|_{m_4} + |a_2|_{m_4} = \quad \left|\tfrac{1}{3}X\right|_7 + 2$
7a. $|a_2|_{m_2} = \quad 1$
7b. $|a_2|_{m_3} = \quad 1$
7c. $|a_2|_{m_4} = \quad 1$
8a. $\left|\tfrac{1}{m_1}(X - a_1 - a_2)\right|_{m_2} = \quad 0$
8b. $\left|\tfrac{1}{m_1}(X - a_1 - a_2)\right|_{m_3} = |a_3 m_2|_{m_3} = \quad 1$
8c. $\left|\tfrac{1}{m_1}(X - a_1 - a_2)\right|_{m_4} = |a_4 m_2 m_3|_{m_4} + |a_3 m_2|_{m_4} = \quad \left|\tfrac{1}{3}X\right|_7 + 1$
9a. $\left|\tfrac{1}{m_2}\right|_{m_3} = \quad 1$
9b. $\left|\tfrac{1}{m_2}\right|_{m_4} = \quad 3$
10a. $\left|\tfrac{1}{m_1}\tfrac{1}{m_2}(X - a_1 - a_2)\right|_{m_3} = |a_3|_{m_3} = a_3 = \boxed{1 = a_3}$
10b. $\left|\tfrac{1}{m_1}\tfrac{1}{m_2}(X - a_1 - a_2)\right|_{m_4} = |a_4 m_3|_{m_4} + |a_3|_{m_4} = \quad \left|\tfrac{1}{3}\tfrac{1}{5}X\right|_7 + 3$
11a. $|a_3|_{m_3} = \quad 1$
11b. $|a_3|_{m_4} = \quad 1$
12a. $\left|\tfrac{1}{m_1}\tfrac{1}{m_2}(X - a_1 - a_2 - a_3)\right|_{m_3} = \quad 0$
12b. $\left|\tfrac{1}{m_1}\tfrac{1}{m_2}(X - a_1 - a_2 - a_3)\right|_{m_4} = |a_4 m_3|_{m_4} \quad \left|\tfrac{1}{3}\tfrac{1}{5}X\right|_7 + 2$
13. $\left|\tfrac{1}{m_3}\right|_{m_4} \quad 4$
14. $\left|\tfrac{1}{m_1}\tfrac{1}{m_2}\tfrac{1}{m_3}(X - a_1 - a_2 - a_3)\right|_{m_4} = |a_4|_{m_4} = a_4 = \boxed{\left|\tfrac{1}{3}\tfrac{1}{5}\tfrac{1}{2}X\right|_7 + \left|\tfrac{1}{2}\right|_7 2 = a_4}$

FIG. 11

$m_1 = 3 \quad m_2 = 5 \quad m_3 = 2 \quad m_4 = 7$
$r_1 = 1 \quad r_2 = 4 \quad r_3 = 1 \quad r_4 = |X|_7$ 1. $X = a_4 m_1 m_2 m_3 + a_3 m_1 m_2 + a_2 m_1 + a_1$
2a. $|X|m_1 = |a_1| m_1 = a_1 = \boxed{1 = a_1}$
2b. $|X|m_2 = |a_2 m_1| m_2 + |a_1| m_2 = \quad 4$
2c. $|X|m_3 = |a_3 m_1 m_2|m_3 + |a_2 m_1|m_3 + |a_1|m_3 = \quad 1$
2d. $|X|m_4 = |a_4 m_1 m_2 m_3|m_4 + |a_3 m_1 m_2|m_4 + |a_2 m_1|m_4 + |a_1|m_4 = \quad 0$
3a. $|a_1|m_1 = \quad 1$
3b. $|a_1|m_2 = \quad 1$
3c. $|a_1|m_3 = \quad 1$
3d. $|a_1|m_4 = \quad 1$
4a. $|X - a_1|m_1 = \quad 0$
4b. $|X - a_1|m_2 = |a_2 m_1|m_2 = \quad 3$
4c. $|X - a_1|m_3 = |a_3 m_1 m_2|m_3 + |a_2 m_1|m_3 = \quad 0$
4d. $|X - a_1|m_4 = |a_4 m_1 m_2 m_3|m_4 + |a_3 m_1 m_2|m_4 + |a_2 m_1|m_4 = \quad 6$
5a. $\left|\frac{1}{m_1}\right|m_2 = \quad 2$
5b. $\left|\frac{1}{m_1}\right|m_3 = \quad 1$
5c. $\left|\frac{1}{m_1}\right|m_4 = \quad 5$
6a. $\left|\frac{1}{m_1}(X - a_1)\right|m_2 = |a_2|m_2 = a_2 = \boxed{1 = a_2}$
6b. $\left|\frac{1}{m_1}(X - a_1)\right|m_3 = |a_3 m_2|m_3 + |a_2|m_3 = \quad 0$
6c. $\left|\frac{1}{m_1}(X - a_1)\right|m_4 = |a_4 m_2 m_3|m_4 + |a_3 m_2|m_4 + |a_2|m_4 = \quad 2$
7a. $|a_2|m_2 = \quad 1$
7b. $|a_2|m_3 = \quad 1$
7c. $|a_2|m_4 = \quad 1$
8a. $\left|\frac{1}{m_1}(X - a_1 - a_2)\right|m_2 = \quad 0$
8b. $\left|\frac{1}{m_1}(X - a_1 - a_2)\right|m_3 = |a_3 m_2|m_3 = \quad 1$
8c. $\left|\frac{1}{m_1}(X - a_1 - a_2)\right|m_4 = |a_4 m_2 m_3|m_4 + |a_3 m_2|m_4 = \quad 1$
9a. $\left|\frac{1}{m_2}\right|m_3 = \quad 1$
9b. $\left|\frac{1}{m_2}\right|m_4 = \quad 3$
10a. $\left|\frac{1}{m_1}\frac{1}{m_2}(X - a_1 - a_2)\right|m_3 = |a_3|m_3 = a_3 = \boxed{1 = a_3}$
10b. $\left|\frac{1}{m_1}\frac{1}{m_2}(X - a_1 - a_2)\right|m_4 = |a_4 m_3|m_4 + |a_3|m_4 = \quad 3$
11a. $|a_3|m_3 = \quad 1$
11b. $|a_3|m_4 = \quad 1$
12a. $\left|\frac{1}{m_1}\frac{1}{m_2}(X - a_1 - a_2 - a_3)\right|m_3 = \quad 0$
12b. $\left|\frac{1}{m_1}\frac{1}{m_2}(X - a_1 - a_2 - a_3)\right|m_4 = |a_4 m_3|m_4 \quad \boxed{2 = 5}$

FIG. 16

| DECIMAL NUMBER | RING POSITION | RESIDUE NUMBER | | | | MIXED BASE NUMBER | | | |
|---|---|---|---|---|---|---|---|---|---|
| | | $r_4$ ($m_4=7$) | $r_3$ ($m_3=2$) | $r_2$ ($m_2=5$) | $r_1$ ($m_1=3$) | $a_r$ | $a_3$ | $a_2$ | $a_1$ |
| -20 | 190 | 1 | 0 | 0 | 1 | 6 | 0 | 3 | 1 |
| -19 | 191 | 2 | 1 | 1 | 2 | 6 | 0 | 3 | 2 |
| -18 | 192 | 3 | 0 | 2 | 0 | 6 | 0 | 4 | 0 |
| -17 | 193 | 4 | 1 | 3 | 1 | 6 | 0 | 4 | 1 |
| -16 | 194 | 5 | 0 | 4 | 2 | 6 | 0 | 4 | 2 |
| -15 | 195 | 6 | 1 | 0 | 0 | 6 | 1 | 0 | 0 |
| -14 | 196 | 0 | 0 | 1 | 1 | 6 | 1 | 0 | 1 |
| -13 | 197 | 1 | 1 | 2 | 2 | 6 | 1 | 0 | 2 |
| -12 | 198 | 2 | 0 | 3 | 0 | 6 | 1 | 1 | 0 |
| -11 | 199 | 3 | 1 | 4 | 1 | 6 | 1 | 1 | 1 |
| -10 | 200 | 4 | 0 | 0 | 2 | 6 | 1 | 1 | 2 |
| -9 | 201 | 5 | 1 | 1 | 0 | 6 | 1 | 2 | 0 |
| -8 | 202 | 6 | 0 | 2 | 1 | 6 | 1 | 2 | 1 |
| -7 | 203 | 0 | 1 | 3 | 2 | 6 | 1 | 2 | 2 |
| -6 | 204 | 1 | 0 | 4 | 0 | 6 | 1 | 3 | 0 |
| -5 | 205 | 2 | 1 | 0 | 1 | 6 | 1 | 3 | 1 |
| -4 | 206 | 3 | 0 | 1 | 2 | 6 | 1 | 3 | 2 |
| -3 | 207 | 4 | 1 | 2 | 0 | 6 | 1 | 4 | 0 |
| -2 | 208 | 5 | 0 | 3 | 1 | 6 | 1 | 4 | 1 |
| -1 | 209 | 6 | 1 | 4 | 2 | 6 | 1 | 4 | 2 |
| 0 | 0 | 0 | 0 | 0 | 0 | 0 | 0 | 0 | 0 |
| 1 | 1 | 1 | 1 | 1 | 1 | 0 | 0 | 0 | 1 |
| 2 | 2 | 2 | 0 | 2 | 2 | 0 | 0 | 0 | 2 |
| 3 | 3 | 3 | 1 | 3 | 0 | 0 | 0 | 1 | 0 |
| 4 | 4 | 4 | 0 | 4 | 1 | 0 | 0 | 1 | 1 |
| 5 | 5 | 5 | 1 | 0 | 2 | 0 | 0 | 1 | 2 |
| 6 | 6 | 6 | 0 | 1 | 0 | 0 | 0 | 2 | 0 |
| 7 | 7 | 0 | 1 | 2 | 1 | 0 | 0 | 2 | 1 |
| 8 | 8 | 1 | 0 | 3 | 2 | 0 | 0 | 2 | 2 |
| 9 | 9 | 2 | 1 | 4 | 0 | 0 | 0 | 3 | 0 |
| 10 | 10 | 3 | 0 | 0 | 1 | 0 | 0 | 3 | 1 |
| 11 | 11 | 4 | 1 | 1 | 2 | 0 | 0 | 3 | 2 |
| 12 | 12 | 5 | 0 | 2 | 0 | 0 | 0 | 4 | 0 |
| 13 | 13 | 6 | 1 | 3 | 1 | 0 | 0 | 4 | 1 |
| 14 | 14 | 0 | 0 | 4 | 2 | 0 | 0 | 4 | 2 |
| 15 | 15 | 1 | 1 | 0 | 0 | 0 | 1 | 0 | 0 |
| 16 | 16 | 2 | 0 | 1 | 1 | 0 | 1 | 0 | 1 |
| 17 | 17 | 3 | 1 | 2 | 2 | 0 | 1 | 0 | 2 |
| 18 | 18 | 4 | 0 | 3 | 0 | 0 | 1 | 1 | 0 |
| 19 | 19 | 5 | 1 | 4 | 1 | 0 | 1 | 1 | 1 |
| 20 | 20 | 6 | 0 | 0 | 2 | 0 | 1 | 1 | 2 |

VALID RANGE -15 TO +14

FIG. 21

| DECIMAL NUMBER | RING POSITION | RESIDUE NUMBER | | | | MIXED BASE NUMBER | | | |
|---|---|---|---|---|---|---|---|---|---|
| | | $r_4$ ($m_4$=7) | $r_3$ ($m_3$=5) | $r_2$ ($m_2$=3) | $r_1$ ($m_1$=2) | $a_4$ | $a_3$ | $a_2$ | $a_1$ |
| -20 | 190 | 1 | 0 | 1 | 0 | 6 | 1 | 2 | 0 |
| -19 | 191 | 2 | 1 | 2 | 1 | 6 | 1 | 2 | 1 |
| -18 | 192 | 3 | 2 | 0 | 0 | 6 | 2 | 0 | 0 |
| -17 | 193 | 4 | 3 | 1 | 1 | 6 | 2 | 0 | 1 |
| -16 | 194 | 5 | 4 | 2 | 0 | 6 | 2 | 1 | 0 |
| -15 | 195 | 6 | 0 | 0 | 1 | 6 | 2 | 1 | 1 |
| -14 | 196 | 0 | 1 | 1 | 0 | 6 | 2 | 2 | 0 |
| -13 | 197 | 1 | 2 | 2 | 1 | 6 | 2 | 2 | 1 |
| -12 | 198 | 2 | 3 | 0 | 0 | 6 | 3 | 0 | 0 |
| -11 | 199 | 3 | 4 | 1 | 1 | 6 | 3 | 0 | 1 |
| -10 | 200 | 4 | 0 | 2 | 0 | 6 | 3 | 1 | 0 |
| -9 | 201 | 5 | 1 | 0 | 1 | 6 | 3 | 1 | 1 |
| -8 | 202 | 6 | 2 | 1 | 0 | 6 | 3 | 2 | 0 |
| -7 | 203 | 0 | 3 | 2 | 1 | 6 | 3 | 2 | 1 |
| -6 | 204 | 1 | 4 | 0 | 0 | 6 | 4 | 0 | 0 |
| -5 | 205 | 2 | 0 | 1 | 1 | 6 | 4 | 0 | 1 |
| -4 | 206 | 3 | 1 | 2 | 0 | 6 | 4 | 1 | 0 |
| -3 | 207 | 4 | 2 | 0 | 1 | 6 | 4 | 1 | 1 |
| -2 | 208 | 5 | 3 | 1 | 0 | 6 | 4 | 2 | 0 |
| -1 | 209 | 6 | 4 | 2 | 1 | 6 | 4 | 2 | 1 |
| 0 | 0 | 0 | 0 | 0 | 0 | 0 | 0 | 0 | 0 |
| 1 | 1 | 1 | 1 | 1 | 1 | 0 | 0 | 0 | 1 |
| 2 | 2 | 2 | 2 | 2 | 0 | 0 | 0 | 1 | 0 |
| 3 | 3 | 3 | 3 | 0 | 1 | 0 | 0 | 1 | 1 |
| 4 | 4 | 4 | 4 | 1 | 0 | 0 | 0 | 2 | 0 |
| 5 | 5 | 5 | 0 | 2 | 1 | 0 | 0 | 2 | 1 |
| 6 | 6 | 6 | 1 | 0 | 0 | 0 | 1 | 0 | 0 |
| 7 | 7 | 0 | 2 | 1 | 1 | 0 | 1 | 0 | 1 |
| 8 | 8 | 1 | 3 | 2 | 0 | 0 | 1 | 1 | 0 |
| 9 | 9 | 2 | 4 | 0 | 1 | 0 | 1 | 1 | 1 |
| 10 | 10 | 3 | 0 | 1 | 0 | 0 | 1 | 2 | 0 |
| 11 | 11 | 4 | 1 | 2 | 1 | 0 | 1 | 2 | 1 |
| 12 | 12 | 5 | 2 | 0 | 0 | 0 | 2 | 0 | 0 |
| 13 | 13 | 6 | 3 | 1 | 1 | 0 | 2 | 0 | 1 |
| 14 | 14 | 0 | 4 | 2 | 0 | 0 | 2 | 1 | 0 |
| 15 | 15 | 1 | 0 | 0 | 1 | 0 | 2 | 1 | 1 |
| 16 | 16 | 2 | 1 | 1 | 0 | 0 | 2 | 2 | 0 |
| 17 | 17 | 3 | 2 | 2 | 1 | 0 | 2 | 2 | 1 |
| 18 | 18 | 4 | 3 | 0 | 0 | 0 | 3 | 0 | 0 |
| 19 | 19 | 5 | 4 | 1 | 1 | 0 | 3 | 0 | 1 |
| 20 | 20 | 6 | 0 | 2 | 0 | 0 | 3 | 1 | 0 |

VALID RANGE -12 TO +11

FIG. 22

| DECIMAL NUMBER | RING POSITION | RESIDUE NUMBER | | | | MIXED BASE NUMBER | | | |
|---|---|---|---|---|---|---|---|---|---|
| | | $r_4$ ($m_4$=7) | $r_3$ ($m_3$=3) | $r_2$ ($m_2$=5) | $r_1$ ($m_1$=2) | $a_4$ | $a_3$ | $a_2$ | $a_1$ |
| -20 | 190 | 1 | 1 | 0 | 0 | 6 | 1 | 0 | 0 |
| -19 | 191 | 2 | 2 | 1 | 1 | 6 | 1 | 0 | 1 |
| -18 | 192 | 3 | 0 | 2 | 0 | 6 | 1 | 1 | 0 |
| -17 | 193 | 4 | 1 | 3 | 1 | 6 | 1 | 1 | 1 |
| -16 | 194 | 5 | 2 | 4 | 0 | 6 | 1 | 2 | 0 |
| -15 | 195 | 6 | 0 | 0 | 1 | 6 | 1 | 2 | 1 |
| -14 | 196 | 0 | 1 | 1 | 0 | 6 | 1 | 3 | 0 |
| -13 | 197 | 1 | 2 | 2 | 1 | 6 | 1 | 3 | 1 |
| -12 | 198 | 2 | 0 | 3 | 0 | 6 | 1 | 4 | 0 |
| -11 | 199 | 3 | 1 | 4 | 1 | 6 | 1 | 4 | 1 |
| -10 | 200 | 4 | 2 | 0 | 0 | 6 | 2 | 0 | 0 |
| -9 | 201 | 5 | 0 | 1 | 1 | 6 | 2 | 0 | 1 |
| -8 | 202 | 6 | 1 | 2 | 0 | 6 | 2 | 1 | 0 |
| -7 | 203 | 0 | 2 | 3 | 1 | 6 | 2 | 1 | 1 |
| -6 | 204 | 1 | 0 | 4 | 0 | 6 | 2 | 2 | 0 |
| -5 | 205 | 2 | 1 | 0 | 1 | 6 | 2 | 2 | 1 |
| -4 | 206 | 3 | 2 | 1 | 0 | 6 | 2 | 3 | 0 |
| -3 | 207 | 4 | 0 | 2 | 1 | 6 | 2 | 3 | 1 |
| -2 | 208 | 5 | 1 | 3 | 0 | 6 | 2 | 4 | 0 |
| -1 | 209 | 6 | 2 | 4 | 1 | 6 | 2 | 4 | 1 |
| 0 | 0 | 0 | 0 | 0 | 0 | 0 | 0 | 0 | 0 |
| 1 | 1 | 1 | 1 | 1 | 1 | 0 | 0 | 0 | 1 |
| 2 | 2 | 2 | 2 | 2 | 0 | 0 | 0 | 1 | 0 |
| 3 | 3 | 3 | 0 | 3 | 1 | 0 | 0 | 1 | 1 |
| 4 | 4 | 4 | 1 | 4 | 0 | 0 | 0 | 2 | 0 |
| 5 | 5 | 5 | 2 | 0 | 1 | 0 | 0 | 2 | 1 |
| 6 | 6 | 6 | 0 | 1 | 0 | 0 | 0 | 3 | 0 |
| 7 | 7 | 0 | 1 | 2 | 1 | 0 | 0 | 3 | 1 |
| 8 | 8 | 1 | 2 | 3 | 0 | 0 | 0 | 4 | 0 |
| 9 | 9 | 2 | 0 | 4 | 1 | 0 | 0 | 4 | 1 |
| 10 | 10 | 3 | 1 | 0 | 0 | 0 | 1 | 0 | 0 |
| 11 | 11 | 4 | 2 | 1 | 1 | 0 | 1 | 0 | 1 |
| 12 | 12 | 5 | 0 | 2 | 0 | 0 | 1 | 1 | 0 |
| 13 | 13 | 6 | 1 | 3 | 1 | 0 | 1 | 1 | 1 |
| 14 | 14 | 0 | 2 | 4 | 0 | 0 | 1 | 2 | 0 |
| 15 | 15 | 1 | 0 | 0 | 1 | 0 | 1 | 2 | 1 |
| 16 | 16 | 2 | 1 | 1 | 0 | 0 | 1 | 3 | 0 |
| 17 | 17 | 3 | 2 | 2 | 1 | 0 | 1 | 3 | 1 |
| 18 | 18 | 4 | 0 | 3 | 0 | 0 | 1 | 4 | 0 |
| 19 | 19 | 5 | 1 | 4 | 1 | 0 | 1 | 4 | 1 |
| 20 | 20 | 6 | 2 | 0 | 0 | 0 | 2 | 0 | 0 |

VALID RANGE -10 TO +9

PIPELINED RESIDUE TO MIXED BASE CONVERTER AND BASE EXTENSION PROCESSOR

BACKGROUND OF THE INVENTION

The invention is in the field of information processing. Specifically, the invention relates to conversion from residue number system (RNS) representations of data to mixed base number system representations of data and to extending the base of RNS numbers.

The RNS has received considerable attention in recent times as an effective tool for performing single step, parallel computation of sums, differences, and products. A system employing the RNS may be used for high speed, real time, parallel processing of data.

A difficulty associated with actually achieving fast computation with the RNS is that a RNS representation of a number does not provide explicit sign and magnitude information. The lack of explicit sign and magnitude information hinders overflow detection and rescaling. The capability to detect overflow is a fundamental requirement of any general purpose computer. A slow overflow detection system slows the speed of the entire computational process.

*Residue Arithmetic and Its Application to Computer Technology*, N.S. Szabo and R.I. Tanaka, (McGraw Hill, New York, 1967), "Residue Arithmetic: A Tutorial with Examples," F.J. Taylor Computer Vol. 17, No. 5, pp. 50–62 (May 1984), and U.S. Pat. No. 4,797,843 issued to Falk et al on Jan. 10, 1989, all incorporated by reference, provide general background information on the RNS and the mixed base number system.

Optical information processors which are ideally suited to perform the parallel computations required in RNS arithmetic are currently under development. There are fundamental differences between optical processors based on optical circuits in which the information carriers are photons and electronic processors based on electronic circuits in which the information carriers are electrons. In optical circuits the photon carriers do not interact with one another, while in electronic circuits the electron carriers do interact with one another. This fact means that in optical circuits interconnect possibilities exist that do not exist with electronic circuits. In particular, optical circuits allow parallel architectures which perform arithmetic and logical operations in completely parallel, single step processes. Since the speed of optical devices is essentially limited to the time it takes for a photon to transit a device, no faster computation time is possible.

Co-pending application 07/414,475, filed Sep. 29, 1989 entitled "Residue Addition Overflow Detection Processor" by T.L. Houk filed concurrently herewith and incorporated herein by reference, discloses a high speed RNS addition overflow detection processor. The residue addition overflow detection processor disclosed in this copending application requires a high speed base extension circuit and a high speed residue to mixed base converter. This application describes a pipelined residue to mixed base converter and base extension processor suitable for use in the residue addition overflow detection processor cited above.

Co-pending application 07/414,474, filed Sep. 29, 1989 entitled "Parallel Residue to Mixed Base Converter" by R.A. Falk also discloses a residue to mixed base converter suitable for use in the residue addition overflow detection processor cited above. The mixed base converters of the "Parallel Residue to Mixed Base Converter" copending application and the instant application are complementary. The mixed base converter of the "Parallel Residue to Mixed Base Converter" co-pending application performs conversion in a single step; however, it requires more hardware than the instant invention. The instant invention requires less hardware than the converter of the "Parallel Residue to Mixed Base Converter" co-pending application, although the instant invention requires several processing steps. Accordingly, the instant invention would be employed where hardware minimization is a major concern, whereas the converter of the "Parallel Residue to Mixed Base Converter" co-pending application could be employed where minimization of operational time is paramount.

U.S. Pat. No. 4,752,904 issued to Paul, No. 4,709,345 issued to Vu, No. 4,528,641 issued to Burrows, and No. 4,281,391 issued to Huang disclose residue to mixed base converters which use ROMs (read only memory) and latches, adders, or complex processors to implement the conversion process. The inventions disclosed in these patents require complex hardware, and are thus unsuitable for many applications.

Accordingly, there is a need for a simple and high speed base extension processor and for a residue to mixed base converter which requires a minimum of complex hardware.

SUMMARY OF THE INVENTION

It is an object of the invention, therefore, to provide a simple and high spaced base extension processor.

Another object of the invention is to provide a residue to mixed base converter which requires a minimum of complex hardware.

Another object of the invention is to provide a base extension processor and a pipelined residue to mixed base converter which uses optical technologies to realize an efficient processor and converter, and which can be efficiently used in conjunction with other optical processing elements.

According to a first aspect of the invention there is provided an information processor which receives a residue number as an input. The information processor includes a plurality of optical arithmetic and logic units (OALUs) arranged in channels and stages. Each digit of the residue input number corresponds to a channel which produces a mixed base digit associated with the residue input number. The stages are serially arranged to successively generate mixed base digits corresponding to the residue number by performing modular multiplication and modular subtraction. The information processor can also include delay circuits arranged parallel to the plurality of OALUs so that all of the mixed base digits are transmitted from the information processor at essentially the same time. The mixed base digits can also be used to generate a redundant residue digit in a separate channel.

According to a second aspect of the invention, there is provided an information processor which receives a residue number as an input. This information processor includes a plurality of arithmetic units arranged in a plurality of stages. Odd stages of the plurality of stages perform first arithmetic operations in parallel. Even stages of the plurality of stages perform second arithmetic operations in parallel. The odd and even stages alternately perform the first operations and second operations to generate at least one mixed base digit corresponding to the residue number. The at least one mixed base digit can also be used to generate a redundant residue digit.

According to a third aspect of the invention there is provided a method of processing a residue input number to generate mixed base digits corresponding to the residue input number. In this method, the residue input number is received and then a first digit of the residue input number is subtracted from other digits of the residue input number. In parallel with this subtracting, the first digit of the residue input number is delayed in time. Then, each of the other digits of the residue input number is multiplied by multiplicative inverses to produce a signal indicative of a second mixed base digit. In parallel with this multiplying, the signal representing the first digit of the residue input number is delayed in time. The second mixed base digit can be used to generate a redundant residue digit.

BRIEF DESCRIPTION OF THE DRAWINGS

The invention is described below with reference to the accompanying drawings, wherein:

FIG. 1 is a table illustrating decimal, residue, and mixed base representations of the decimal numbers 0 through 29;

FIG. 5 illustrates a numerical example;

FIG. 6 is a table illustrating decimal, residue, and mixed base representations of the decimal numbers −15 to 14;

FIG. 8 is a table illustrating decimal, residue, and mixed base representations of the decimal numbers −15 to 14 in which the third mixed base digit indicates the sign of the number;

FIG. 9 is a table illustrating decimal, residue, and mixed base representations of the decimal numbers 0 to 40 with a redundant modulus of 7;

FIG. 10 illustrates a numerical example;

FIG. 11 illustrates a numerical example;

FIG. 16 lists values corresponding to the FIG. 15 ring;

FIG. 21 illustrates a numerical example; and

FIG. 22 illustrates a numerical example.

DETAILED DESCRIPTION OF THE PREFERRED EMBODIMENTS

Residue and Mixed Base Number Theory

Figures 2, 3, 4:
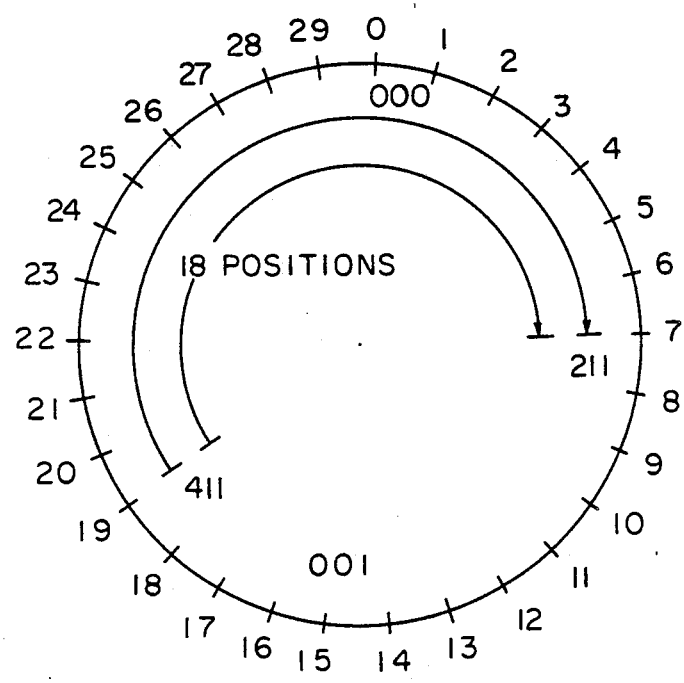
FIG. 2 illustrates an example of overflow occurring in RNS addition.
FIG. 3 is a table which lists multiplicative inverses of decimal numbers 1, 2, 3, and 4.
FIG. 4 illustrates the RNS ring associated with FIGS. 1 and 2.

An integer is represented in the RNS by writing down an n-tuple where the $i^{th}$ digit is the remainder, $r_i$, after division of the integer by an associated modulus, $m_i$. FIG. 1 lists RNS representations of the decimal numbers 0 to 29, when the moduli are 2, 3, and 5. For example, the decimal number 7 is represented as 211 in RNS representation. If the moduli are chosen to be mutually prime, then all integers within the range of zero to the product of the moduli minus one can be uniquely represented.

The importance of the residue number system to numerical processing is that the operations of addition, subtraction, and multiplication can be performed without the use of carry operations between the moduli. In other words, each digit in the n-tuple can be operated on independently and in parallel. For example, if n-tuples X, having digits $x_1 ... x_n$, and y, having digits $y_1 ... y_n$, are added to produce Z, having digits $z_1 ... z_n$, then the $i^{th}$ digit is given by:

$$z_i = (X_i + Y_i) \bmod m_i \qquad (1)$$

The mod function takes the number in front of "mod," in this case $x_i + y_i$, divides this number by the number after "mod," in this case $m_i$, and substitutes the remainder for the entire function. Equation (1) may also be expressed in shorthand notation as:

$$Z_i = |X_i + Y_i|m_i \qquad (2)$$

In a similar fashion, in RNS multiplication the product of $x_i$ and $y_i$, $x_i \cdot y_i$, is divided by m and the remainder is substituted for the entire function.

The power of RNS representation is that an operation on large numbers can be broken down into small parallel modular operations. For example, a 16 bit binary number can be represented in RNS using the five moduli 5, 7, 11, 13 and 17. Multiplication of two 16 bit binary numbers produces a 32 bit intermediate result and requires 31 carry operations. In contrast, modular arithmetic devices can perform the same multiplication operation in one step per modulus, all steps being performed simultaneously in parallel.

The high speed potential of RNS arithmetic may be effectively exploited by optical computers that excel at parallel operations. Optical computers making use of RNS arithmetic promise at least an order of magnitude improvement in computational speed over standard electronic, binary computers.

A difficulty with RNS representation is that magnitude comparisons can not be determined by a simple one-to-one digit comparison. For example, as seen from FIG. 1, in RNS representation the decimal number 16 which is represented in RNS representation as 110, appears smaller than the decimal number 8, which is represented in RNS representation as 320.

Another difficulty associated with RNS representation is that the occurrence of overflow resulting from addition operations can not be readily detected. For example, if the decimal number 18, which is represented in RNS representation as 300, is added to decimal number 19, which is represented in RNS representation as 411, the RNS result would be 211, as illustrated in FIG. 2. In the range 0–29, the RNS representation 211 corresponds to decimal number 7. There is no way to determine by inspection that overflow has occurred and that the correct sum is not 7. In order to implement a general purpose computer, overflow detection is required.

The multiplicative inverse is useful in solving equations in the RNS. The number a is the multiplicative inverse of b mod m if $0 > a > m$ and $|a \cdot b|_m = 1. = 1$. The multiplicative inverse a is denoted as $$a = \left| \frac{1}{b} \right|_m .$$

FIG. 3 lists the multiplicative inverses of 1, 2, 3, and 4 where m is equal to five. In the general case there is no convenient explicit expression for obtaining the multiplicative inverse of a number. However, if m is a prime number, the multiplicative inverse may be obtained by Fermat's Theorem. Detailed theory concerning the r multiplicative inverse and Fermat's Theorem is discussed in the Szabo and Tanaka text cited above. The implementation of the multiplicative inverse operation in the invention will be described in further detail in connection with the hardware description.

RNS representation and addition overflow can be illustrated by visualizing RNS representation as a ring such as depicted in FIG. 4. It is this periodic or ring property which complicates overflow detection in the RNS representation. If RNS representation is to be unambiguous in computation, a computational system must be implicitly restricted to a single range. There are only a finite number of positions in the RNS ring. In the example illustrated in FIG. 4, there are 30 finite positions. If each of these positions is occupied by one number within the range, the RNS forms a nonredundant ring. A redundant RNS has more positions on the ring than unique members to be represented.

If two large numbers within the range are added, for example decimal 18 and decimal 19, the sum will be an overflow number which also corresponds to a number within the range, for example decimal number 7, represented in RNS as 211. A number within the predefined range is said to be "valid" while a number outside the predefined range is said to be "invalid." An analogous situation occurs in binary computers of fixed word length.

One method of obtaining overflow information requires mixed base representations of the arithmetic operands. Thus, in order to detect overflow an efficient mixed base converter is required. While the mixed base converter described in this application will be described with respect to its use in an overflow detection processor, by way of example, it is understood that the mixed base converter described in this application can be used in other applications where mixed base conversion is required.

A number X may be expressed in mixed base form according to the following equations:

$$X = \sum_{j=1}^{N} a_j w_j \tag{3}$$

where:

$$w_j = \prod_{i=1}^{j-1} m_{i,j} \geq 2 \tag{4}$$

$$w_1 = 1 \; j = 1$$

so that:

$$X = a_N \prod_{i=1}^{N-1} m_i + \ldots + a_3 m_1 m_2 + a_2 m_1 + a_1 \tag{5}$$

The terms $w_1, \ldots, w_j$ are the bases and are related to the moduli of an associated RNS representation according to Equation (4). The terms $a_1, \ldots, a_n$ are the mixed base digits.

Any positive integer in the interval $$\left[ 0, \prod_{i=1}^{N-1} m_i - 1 \right]$$

may be represented in accordance with equation (5), and each integer has a unique representation. FIG. 1 lists the mixed base digits for decimal numbers 0 through 29. In FIG. 1, $w_1$ is 1, $w_2$ is the modulus 2, and $w_3$ is 6, the product of the modulus 2 and the modulus 3. Thus the decimal number 10 is represented as 120, where $a_1$ is O, $a_2$ is 2, and $a_3$ is 1. Decimal numbers may be expressed in the form of Equation (3) by choosing $w_1$ equal to 1, $w_2$ equal to 10, $w_3$ equal to 100, and so on. Binary numbers may be expressed in the form of Equation (3) by choosing $w_1$ equal to 1, $w_2$ equal to 2, $w_3$ equal to 4, and so on.

A mixed base system can be arranged such that:

$$a_j < m_j \tag{6}$$

resulting in the property that:

$$|w_{k+1}| > \left| \sum_{j=1}^{k} a_j w_j \right| \tag{7}$$

The arrangement of Equation (6) results in an ordered sequencing of the mixed base digits. As can be seen from Equation (7), this ordered sequencing allows direct magnitude determination by a comparison of the digits. For example, the mixed base number 220, decimal number 16, can be readily determined to be greater than the mixed base number 110, decimal number 8, since the most significant digit of 220 is greater than the most significant digit of 110.

Mixed base digits $a_1, \ldots, a_n$ may be computed by performing sequential operations on equation (5). Equation (5) is first taken modulo $m_1$. Since all terms except the last term are multiples of $m_1$, Equation (5) becomes:

$$X \bmod m_1 = a_1 \bmod m_1 \tag{8}$$

Since $a_1 < m_1$ in accordance with equation (6), $a_1 \bmod m_1 = a_1$ and therefore:

$$X \bmod m_1 = a_1 \tag{9}$$

Hence, the least significant mixed base digit $a_1$ equals the first residue digit X mod $m_1$, or $r_1$. TO find $r_2$, the next most significant digit, $a_1$ is subtracted from both sides of Equation (5), both sides of the equation are divided by $m_1$ and then the equation is taken modulo $m_2$. These manipulations result in:

$$[(X-a_1)/m_1] \bmod m_2 = a_2 \tag{10}$$

The Division Remainder Zero Theorem developed in the Szabo and Tanaka text, cited above, states that given two numbers or expressions, b and c, the following property holds $$(b/c) \bmod m_i = \left(\frac{1}{c} b\right) \bmod m_i \tag{11}$$

By using Equation (11) with b equal to $(X-a_1)$ and c equal to $m_1$, Equation (10) becomes:

$$\left[\frac{1}{m_1}(X - a_1)\right] \bmod m_2 = a_2 \tag{12}$$

This process is repeated by performing successive subtraction and division steps in RNS until all mixed base digits, including any redundant mixed base digits are calculated. A numerical example illustrating use of Equations (11) and (12) is given in FIG. 5 where $r_1 = 1$, $r_2 = 4$, and $r_3 = 1, 1$, and where $m_1 = 3$, $m_2 = 5$, and $m_3 = 2$. In FIG. 5, steps for different moduli are carried out in parallel. For example, steps 4a, 4b, and 4c are carried out in parallel. FIG. 5 shows that residue digits $r_1 = 1$, $r_2 = 4$, and $r_3 = 1$ correspond to mixed base digits $a_1 = 1$, $a_2 = 1$, and $a_3 = 1$. The residue number $r_1 = 1$, $r_2 = 4$, and $r_3 = 1$ and the mixed base number $a_1 = 1$, $a_2 = 1$ and $a_3 = 1$ correspond to decimal 19 using these moduli.

The RNS to mixed base procedures described above can be used to convert from RNS to decimal representation, for human scrutiny, or to binary representation for electronic computer usage. Conversion to decimal or binary is performed by converting the RNS digits into mixed base digits and then inserting the mixed base digits into Equation (5), representing the mixed base digits and their bases in decimal or binary, respectively, then calculating X. If the computation of X were done in RNS arithmetic, an arithmetic and logic unit the size of the product of the moduli would be required. Such an arithmetic and logic unit would be prohibitively large. By converting a number from RNS to a mixed base binary or decimal representation and then calculating X in accordance with Equation (5), the need for a large arithmetic and logic unit is eliminated.

One consequence of converting from RNS to mixed base representation is that time delays associated with carry propagation in the mixed base conversion process will result in the decimal or binary representations being calculated after RNS calculations have been completed. Thus only a fraction of the numbers being processed by an RNS based processor can be converted into decimal or binary representations without becoming a bottleneck.

Figure 7:
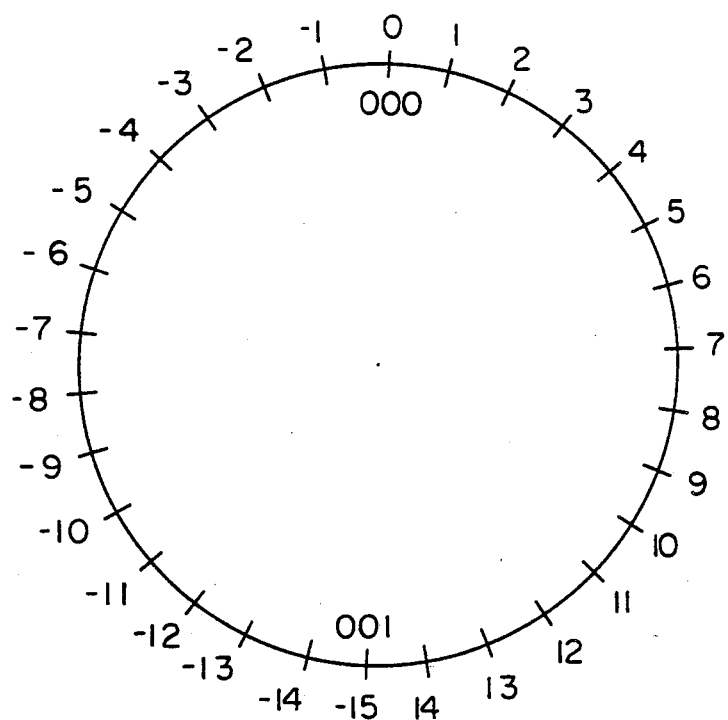
FIG. 7 illustrates the RNS ring associated with FIG. 6.

Negative numbers may also be implicitly represented in RNS representation For example, FIG. 6 illustrates how the integers from $-15$ to 14 may be represented in RNS form. FIG. 7 illustrates the ring corresponding to FIG. 6.

Although RNS arithmetic involving negative numbers can be performed by forming a correspondence table between the negative numbers and associated positive numbers and performing intermediate computation using positive number RNS, it is frequently more useful to treat negative-and-positive-number RNS in a more direct fashion, as illustrated in FIG. 8. In FIG. 8, the order of the RNS digits is arranged such that the $m_3$ modulus is 2. The other moduli, 5 and 3, are arranged in descending order from left to right as $m_2$ and $m_1$ respectively. The mixed base weights for this new order is computed in accordance with equation (4) and mixed base digits $a_3$, $a_2$, and $a_1$ are tabulated in FIG. 8. FIG. 8 shows that $a_3$ can be used to determine whether an associated RNS number is positive or negative. That is, $a_3$ is 0 for all non-negative numbers and 1 for all negative numbers. FIG. 8 is analogous to the two's complement binary representation in which numbers with 1 as the most significant bit are negative and in which the most negative number immediately follows the most positive number.

A non-redundant RNS can be made redundant by the use of an additional, redundant modulus $m_r$. The addition of one or more moduli to a RNS is called extension of the base. The base extension processor generates the residue digit or digits corresponding to the redundant modulus or moduli using the nonredundant residue digits.

An addition overflow detection processor which employs an additional modulus enlarges the ring to a size to which overflow could not occur, performs the addition, and determines whether or not the sum is within the valid range of the original non-redundant ring. Thus, an efficient base extension processor is required for overflow detection processors. While the base extension processor described in this application will be described with respect to its use in an addition overflow detection processor by way of example, it is understood that the base extension processor of the instant application can be used in other applications where base extension is required, for example, a multiplication overflow processor. Several numerical examples will be discussed first in order to better understand the hardware descriptions below.

A new modulus $m_r=7$ is used in conjunction with $m_3=5$, $m_2=3$, and $m_1=$. A new modulus of 7 is chosen because 7 is prime relative to the other modulus. Choosing a relative prime additional modulus ensures that mixed base digit computations and base extension, to be discussed further below, are possible.

The new redundant RNS, in the illustrative example, has moduli of 7, 5, 3, and 2 and a ring circumference $M_r$ of the product of 2, 3, 5, and 7, or 210. Representations are valid in the range 0 to 29 inclusive and invalid in the range 30 to 209 inclusive. Validity can be determined by converting a number from RNS representation into mixed base representation and examining the fourth mixed base digit $a_r$ (or alternatively $a_4$). This fourth mixed base digit $a_r$ is zero for valid numbers and non-zero for invalid numbers as illustrated in FIG. 9. The use of the $a_r$ digit as a validity indicator, and thus an overflow indicator, can be understood from an examination of Equation (4). Since the base $w_4$ associated with the redundant fourth digit $a_r$ is the product of $m_1$, $m_2$, and $m_3$, the base $w_4$ is equal to 2·3·5, or 30. Therefore, $a_r$ will have a non-zero number when the number to be represented is in the invalid range greater than 29.

The general form of the mixed base expansion resulting from the use of a redundant modulus is:

$$X = a_r \prod_{i=1}^{N} m_i + a_N \prod_{i=1}^{N-1} m_i + \ldots a_2 m_1 + a_1 \quad (13)$$

Or alternatively:

$$X = a_r M + \ldots + a_1 \quad (14)$$

where M is the circumference of the non-redundant ring and is calculated in accordance with the following equation:

$$M = \prod_{i=1}^{N} m_i \quad (15)$$

The examples described herein will use only one redundant modulus. However, it is understood that more than one redundant modulus can be added by simply repeating the base extension process.

FIG. 10 illustrates a numerical example of how $a_r$ (or alternatively $a_4$) can be calculated in terms of the multiplicative inverses of the moduli and in terms of the redundant residue digit $|X|_7$ using the mixed base conversion procedure described above. In FIG. 10, positive numbers are carried through the process by adding instead of subtracting. For example, in step 4d, 6 is added to $|X|_7$ rather than substracting 1. Since step 4d is associated with a modulus of 7, adding 6 has the same effect as subtracting 1. The number 6 is called the additive inverse of 1 when the modulus is 7.

Since $a_r$ is equal to zero for X to be valid, the expression obtained in step 14 of FIG. 10 for $a_r$ (or alternatively $a_4$) can be set equal to zero and solved for $|X|_7$. The value of $|X|_7$ is the redundant residue digit which results from the use of an additional redundant modulus. The redundant mixed base digit $a_r$ is set equal to zero as follows:

$$a_r = \left| \frac{1}{2} \; \frac{1}{3} \; \frac{1}{5} X \right|_7 + \left| \frac{1}{2} \right|_7 2 = 0 \quad (16)$$

For Equation (16) to be true the following Equation must be true:

$$\left| \frac{1}{3} \; \frac{1}{5} X \right|_7 + 2 = 0 \quad (17)$$

Solving Equation (17) for $|X|_7$ results in $|X|_7$ being equal to 5 as follows:

$$|X|_7 = ||3 \cdot 5 \cdot (-1)|_7 |2|_7|_7 \quad (18)$$
$$= ||3 \cdot 5|_7 |-1|_7 |2|_7|_7 \quad (19)$$
$$= ||1|_7 |6|_7 |2|_7|_7 \quad (20)$$
$$= |12|_7 = 5 \quad (21)$$

The procedure illustrated in FIG. 10 can be simplified by noting that the divisor of $|X|_7$ in Equation (16) is the non-redundant ring q circumference M, that is, $m_1 \cdot m_2 \cdot m_3$ or $3 \cdot 5 \cdot 2$.

Further, the division by $$\left| \frac{1}{2} \right|_7$$

is unnecessary since this term cancels out in manipulating Equation (16) into Equation (17). Therefore only the additive terms, i.e., the "2" term in steps 12 and 14 of FIG. 10 and in Equations (16)–(21) need be carried through the process as illustrated in FIG. 11.

The simplified process is illustrated in FIG. 11. FIG. 11 illustrates the same process as illustrated in FIG. 10 but with the simplification discussed above. In FIG. 11, step 2d, $|X|_7$ is arbitrarily assumed to be zero. While $|X|_7$ is not necessarily zero, this arbitrary assumption is permissible since only the additive term is used to calculate a final result. The general simplified form of $|X| m_r$, the redundant residue digit, is given by the following equation:

$$|X|_{m_r} = \left| -M \frac{1}{m_N} \right|_{m_r} \cdot |S|_{M_r} \quad (22)$$

where N is the order of the most significant nonredundant modulus;

r is the order of the redundant modulus; and

S is the additive term carried through the conversion process.

Equations 22 and 18 may be compared to verify that Equation 18 fits the general form of Equation 22.

The range of numbers being represented in a RNS is implicit in the residue to mixed base conversion process described above with respect to FIG. 5.

For example, if residue digits $r_1 = 1$, $r_2 = 1$, and $r_3 = 4$ corresponding to moduli of $m_1 = 2$, $m_2 = 3$, and $m_3 = 5$ are processed as discussed above, the resulting mixed base digits $a_1 = 1$, $a_2 = 0$, and $a_3 = 3$ correspond to decimal 19. However, as illustrated in FIG. 6, residue digits $r_1 = 1$, $r_2 = 1$, and $r_3 = 4$ could correspond to decimal $-11$ in negative-and-positive residue representation.

Converter and Processor Hardware

Figure 12:
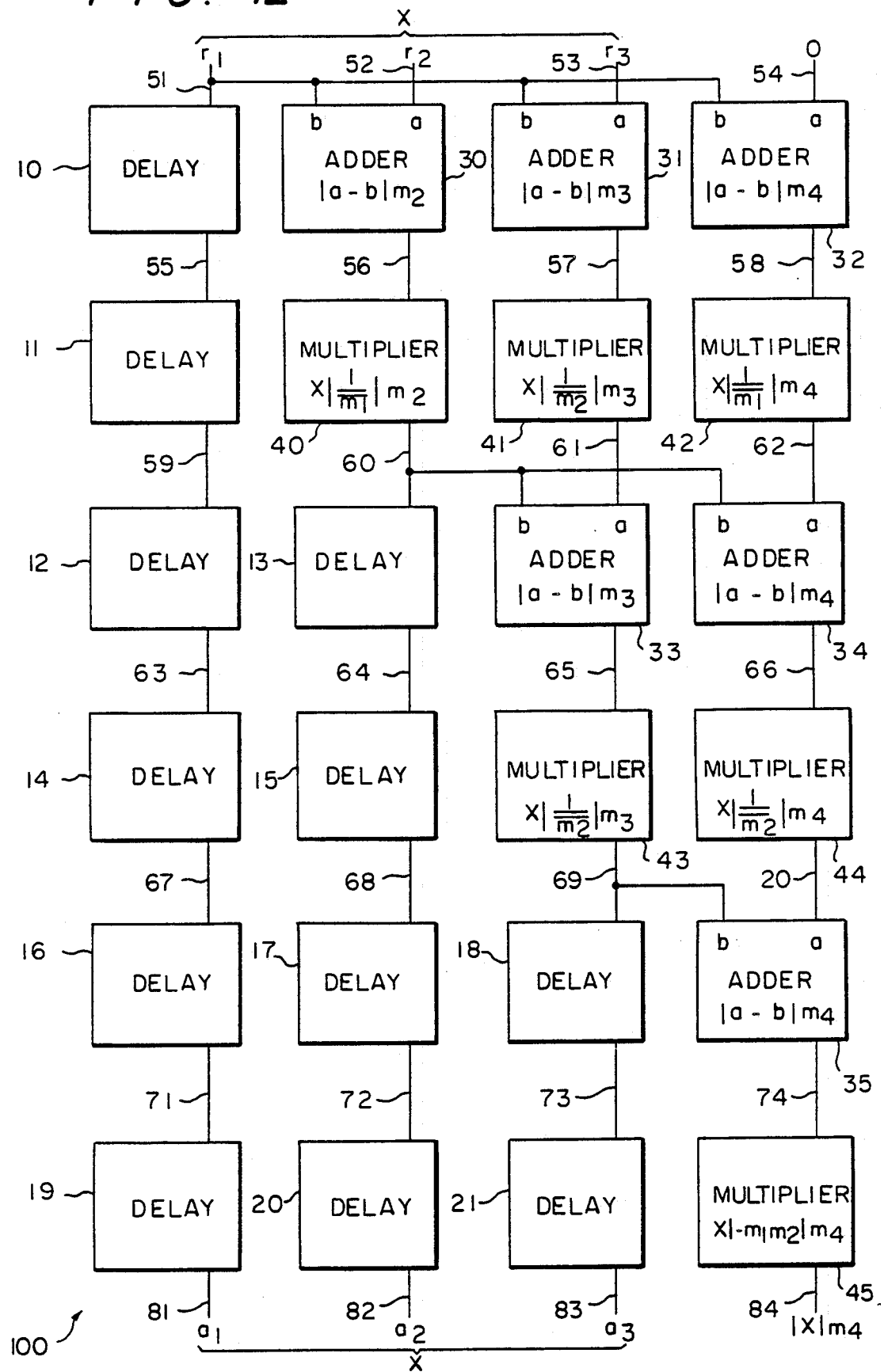
FIG. 12 illustrates a pipelined residue to mixed base converter and base extension processor according to a first preferred embodiment.

FIG. 12 illustrates a pipelined residue to mixed base converter and base extension processor 100 according to a first preferred embodiment of the invention. The converter/processor 100 illustrated in FIG. 12 receives residue input digits $r_1$, $r_2$, and $r_3$, representing number X, and outputs mixed base digits $a_1$, $a_2$, and $a_3$ representing number X, and $|X| m_4$, the redundant residue digit corresponding to a modulus of $m_4$.

The converter/processor 100 can be used in conjunction with optical processing systems such as those disclosed in U.S. Pat. No. 4,797,843 issued Jan. 10, 1989, entitled "Parallel Optical Arithmetic/Logic Unit;" and in copending applications Ser. No. 07/019,761, filed Feb. 27, 1987, entitled "Optical Cross Bar Arithmetic/Logic Unit;" Ser. No. 07/219,392, filed July 15, 1988, entitled "Optical Computer Including Pipelined Conversion of Numbers to Residue Representation;" and Ser. No. 07/233,610, filed Aug. 18, 1988, entitled "Optical Computer Including Parallel Residue to Binary Conversion;" all incorporated herein by reference.

The converter/processor 100 is a pipelined processor, which means that all numbers in a computational stream are given the same algorithmic treatment. Output numbers appear at the same rate as input numbers are fed into the converter/processor 100. A constant time delay exists between receipt of an input number and transmission of its associated output number.

The converter/processor 100 receives residue input digit $r_1$ via optical signal line 51, $r_2$ via optical signal line 52, and $r_3$ via optical signal line 53. Each of signal lines 51, 52 and 53 includes individual signal lines to transmit an input digit in a one-of-many format For example, if $r_1$ corresponds to a modulus of $m_1 = 3$, then signal line 51 includes three individual signal lines only one of which is active at any given time. If a first individual signal line is active then $r_1$ is 0, if a second individual signal line is active then $r_1$ is 1, and if a third individual signal line is active then $r_1$ is 2.

Residue input digit $r_1$ is supplied to a delay circuit 10, and adders 30, 31 and 32 via signal line 51. Residue input digit $r_2$ is supplied to adder 30 via signal line 52. Residue input digit $r_3$ is supplied to adder 31 via signal line 53. The adder 32 also receives a 0 input via a signal line 54. Processing in the delay circuit 10, the adder 30, the adder 31, and the adder 32 occurs in parallel.

Since $r_1$ is the first mixed base digit, $a_1$, $r_1$ is maintained in synchronism with the first stage of processing occurring in adders 30, 31 and 32 so that $r_1$ is available as $a_1$. The delay circuit 10 is designed to delay the $r_1$ signal received in the delay circuit 10 by the period of time it takes the adders 30, 31, and 32 to complete their processing. This provision of a delay circuit(s) in parallel with an arithmetic circuit(s) such as the adders 30, 31, and 32 is important to ensuring the synchronism of the converter/processor 100. Examples of delay circuits, adders, and multipliers will be described in further detailed below after describing the overall operation of the converter/processor 100.

Adders 30, 31, and 32 are residue arithmetic adders with the b input connected to form $(-b) \bmod m$ or $m-b$, the additive inverse of b mod m. By use of the additive inverse the adders 30, 31, and 32 perform subtraction. Adder 30 subtracts $r_1$ from $r_2$ using modulo $m_2$ subtraction and outputs on signal line 56 a signal corresponding to $|a_2 m_1|_{m_2}$. The operation performed by the adder 30 is analogous to step 4b of the numerical example illustrated in FIG. 11. Adder 31 subtracts $r_1$ from $r_3$ using modulo $m_3$ subtraction and transmits on signal line 57 a signal corresponding to $|a_3 m_1 m_2|_{m_3} + |a_2 m_1|_{m_3}$. The operation performed by the adder 31 is analogous to step 4c of FIG. 11. Adder 32 subtracts $r_1$ from zero using modulo $m_4$ subtraction and transmits on signal line 58 a signal corresponding to $|a_4 m_1 m_2 m_3|_{m_4} + |a_3 m_1 m_2|_{m_4} + |a_2 m_1|_{m_4}$. The operation performed by the adder 32 is analogous to step 4d of FIG. 11. The operations performed in delay circuit 10 and adders 30, 31 and 32 constitute the first stage of processing.

In the second stage of processing, the $r_1$ signal transmitted on signal line 55 is delayed by a delay circuit 11 and is transmitted on signal line 59. The signal transmitted on signal line 56 is received in a multiplier 40. Multiplier 40 multiplies the value of the signal received from signal line 56 by the multiplicative inverse of the first modulus $$\left| \frac{1}{m_1} \right|_{m_2}$$

using modulo $m_2$ multiplication and transmits on signal line 60 a signal corresponding to $a_2$, analogous to step 6a of FIG. 11. In a similar manner, a multiplier 41 transmits on signal line 61 a signal corresponding to $|a_3 m_2|_{m_3} + |a_2|_{m_3}$ and a multiplier 42 transmits on signal line 62 a signal corresponding to $|a_4 m_2 m_3|_{m_4} + |a_3 m_2|_{m_4} + |a_2|_{m_4}$. The operations performed by multipliers 41 and 42 are analogous to steps 6b and 6c of FIG. 11, respectively.

In the third processing stage, the $a_1$ signal on signal line 59 is delayed by delay circuit 12. The $a_2$ signal is delayed by delay circuit 13. The $a_2$ signal is also provided to adders 33 and 34 via signal line 60. The adder 33 subtracts $a_2$ from the value received via signal line 61 using modulo $m_3$ subtraction and transmits on signal line 65 a signal corresponding to $|a_3 m_2|_{m_3}$. The operation performed by the adder 33 is analogous to step 8b of FIG. 11. The adder 34 subtracts $a_2$ from the value received via signal line 62 using modulo $m_4$ subtraction and transmits on signal line 66 a signal corresponding to $|a_4 m_2 m_3|_{m_4} + |a_3 m_2|_{m_4}$, analogous to step 8c of FIG. 11.

In the fourth processing stage the $a_1$ and $a_2$ signals are delayed by delay circuits 14 and 15, respectively. The value transmitted via signal line 65 is multiplied by a multiplicative inverse using modulo $m_3$ multiplication in multiplier 43 to transmit on signal line 69 a value corresponding to $a_3$, the third mixed base digit, analogous to step 10a of FIG. 11. The value transmitted via signal line 66 is multiplied using modulo $m_4$ multiplication by a multiplicative inverse in a multiplier 44 to transmit on signal line 70 a value corresponding to $|a_4 m_3|_{m_4} + |a_3|_{m_4}$, analogous to step 10b of FIG. 11.

In the fifth processing stage the $a_1$, $a_2$, and $a_3$ signals are delayed by delay circuits 16, 17 and 18, respectively. The $a_3$ value transmitted via signal line 69 is subtracted from the value received via signal line 70 by an adder 35 to transmit on signal line 74 a sum value S, analogous to step 12b of FIG. 11.

In the sixth processing stage the $a_1$, $a_2$, and $a_3$ signals are delayed by delay circuits 19, 20, and 21. Delay circuits 19, 20, and 21 transmit values of mixed base digits $a_1$, $a_2$, and $a_3$ on signal lines 81, 82, and 83, respectively The mixed base digits $a_1$, $a_2$, and $a_3$ represent the same number as $r_1$, $r_2$, and $r_3$ received by the first processing stage. The S value transmitted on signal line 74 is multiplied by $|-m_1 m_2|_{m_4}$ using modulo $m_4$ multiplication in multiplier 45 in accordance with Equation 22. This multiplied value is transmitted from the multiplier 45 on signal line 84 as $|X|_{m_4}$, the redundant residue digit.

As described above, base extension performed by the converter/processor 100 requires only one additional parallel channel of residue computation plus one multiplication step beyond that required for mixed base digit extraction. If residue to mixed base conversion is required but extension of the base is not required then adders 32, 34, and 35 and multipliers 42, 44, and 45, and associated signal lines need not be provided Similarly, if only base extension is required, then delay circuits 10 through 21 and associated signal lines need not be provided.

If additional, that is, more than one, redundant residue digits are desired, then additional computational channels can be placed in parallel with adders 32, 34, and 35 and multipliers 42, 44, and 45, without increasing the processing time of the converter/processor.

The adder and multipliers of the converter/processor 100 are optical arithmetic and logic units (OALUs). The OALUs employed can be the Fourier transform pattern recognition type described in the '843 patent cited above or the optical cross-bar type described in copending application 07/019,761 cited above. Both of these OALUs perform residue additions and multiplications of two numbers, accepting numerical inputs in the one-of-many format.

Figure 13:
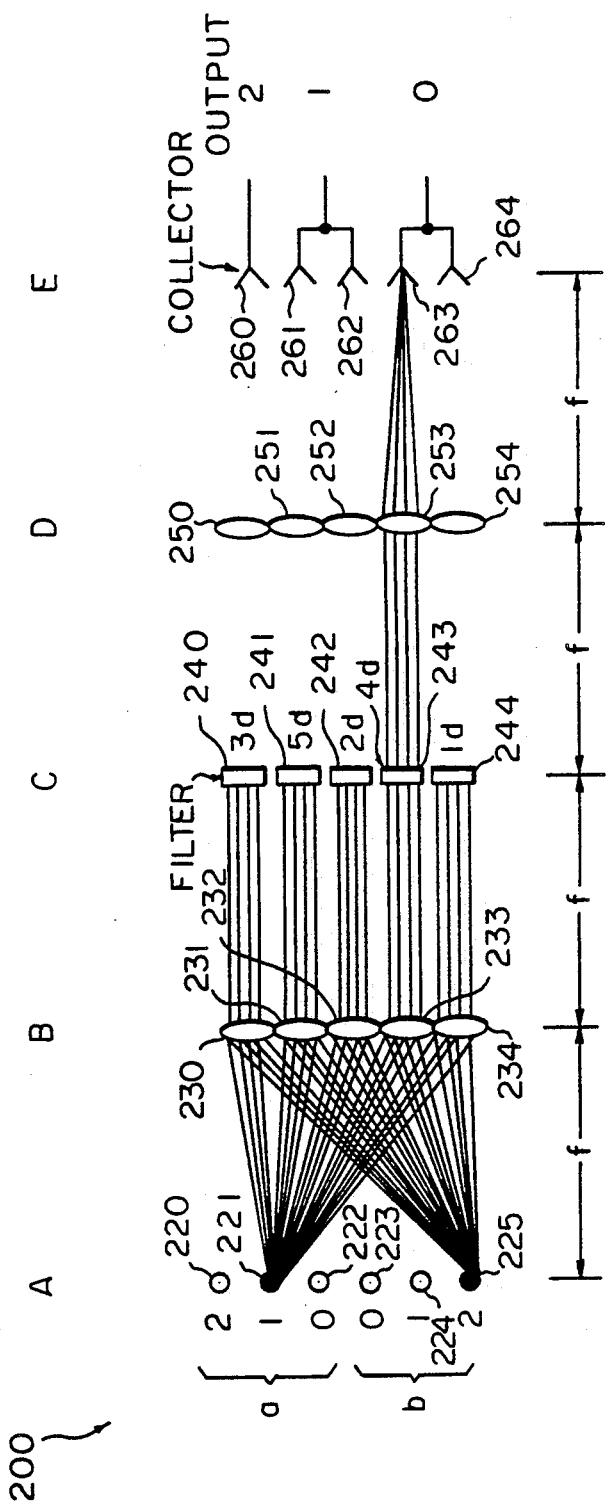
FIG. 13 illustrates a Fourier transform pattern recognition OALU configured as an adder.

FIG. 13 illustrates a Fourier transform pattern recognition OALU 200 configured to add two numbers a and b using modulo 3 addition. In Figure 13, inputs from point-light sources 220, 221, 222, 223, 224, and 225 form a spatial pattern corresponding to a given separation of point-light sources. Lenses 230, 231, 232, 233, and 234 produce Fourier transforms of the source configuration. Filters 240, 241, 242, 243, and 244 allow light energy to pass when the light energy results from a specific spatial pattern. The output of a filter passes through lens 250, 251, 252, 253, or 254 and is detected by collector 260, 261, 262, 263, or 264. The pattern of the point-light sources and the detection values of the filters accomplish the addition process.

Figure 14:
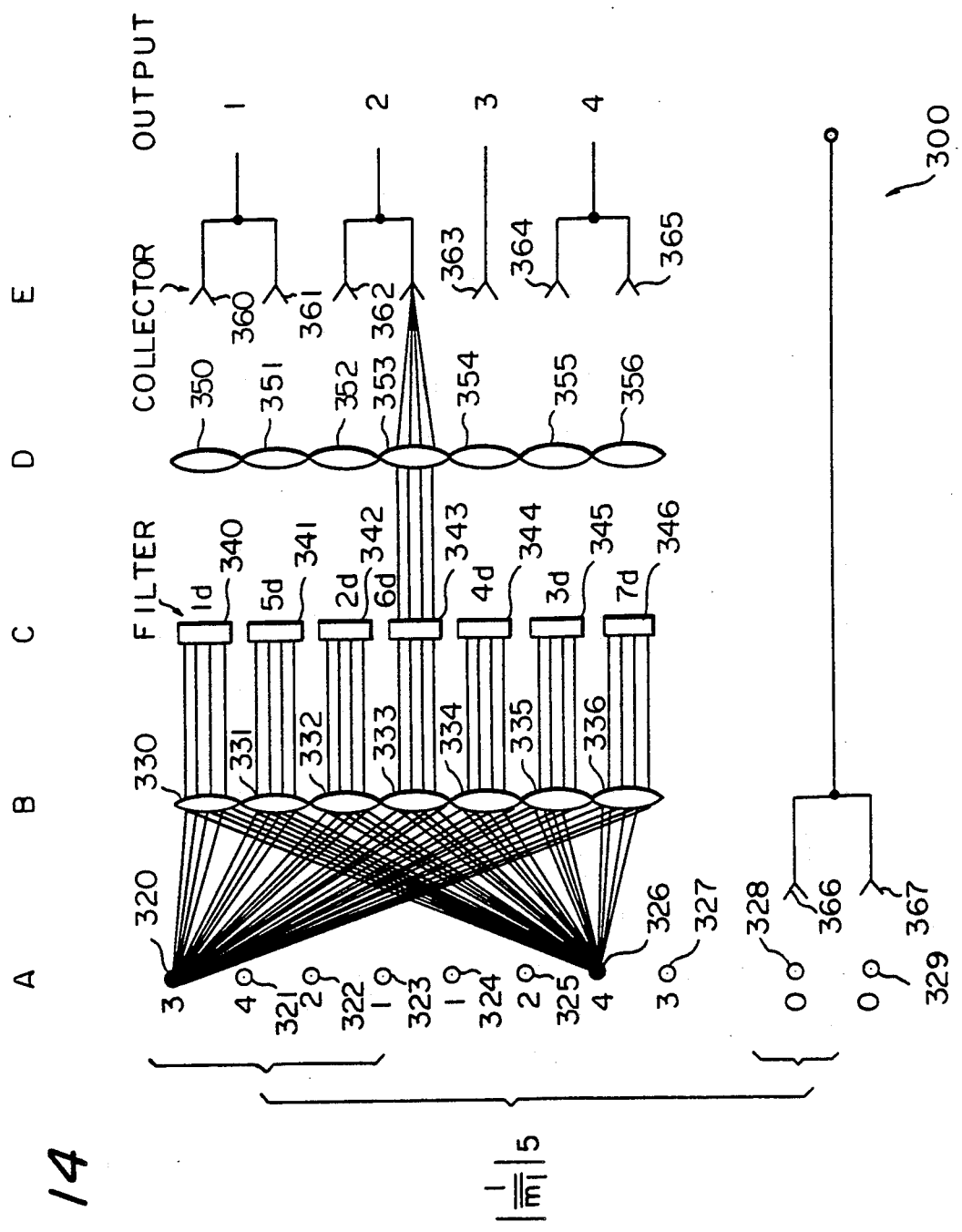
FIG. 14 illustrates a Fourier transform pattern recognition OALU configured as a multiplier.

FIG. 14 illustrates a Fourier transform pattern recognition OALU 300 configured to multiply two input numbers using modulo 5 multiplication. In FIG. 14, one input is fixed at the multiplicative inverse $$\left| \frac{1}{m_i} \right|_5.$$

The multiplier of FIG. 14 is constructed and operated similarly to the adder 200 of FIG. 13. Alternatively, any other RNS optical adder or multiplier can be used as the adders and multipliers of the converter/processor 100. The multipliers can also be fixed interconnect pattern multipliers which exploit the ring property of residue arithmetic to convert a variable input into the desired product. These fixed interconnect pattern multipliers are described in "Optical Computation Using Residue Arithmetic" by A. Huang, Y. Toshida, J.W. Goodman, and S. Ishihara in *Applied Optics* 18, 149–162 (1979), incorporated herein by reference.

Delay circuits of the converter/processor 100 can be an adder configured OALU such as described above in which one operand is zero, or a multiplier configured OALU in which one operand is one.

Figure 15:
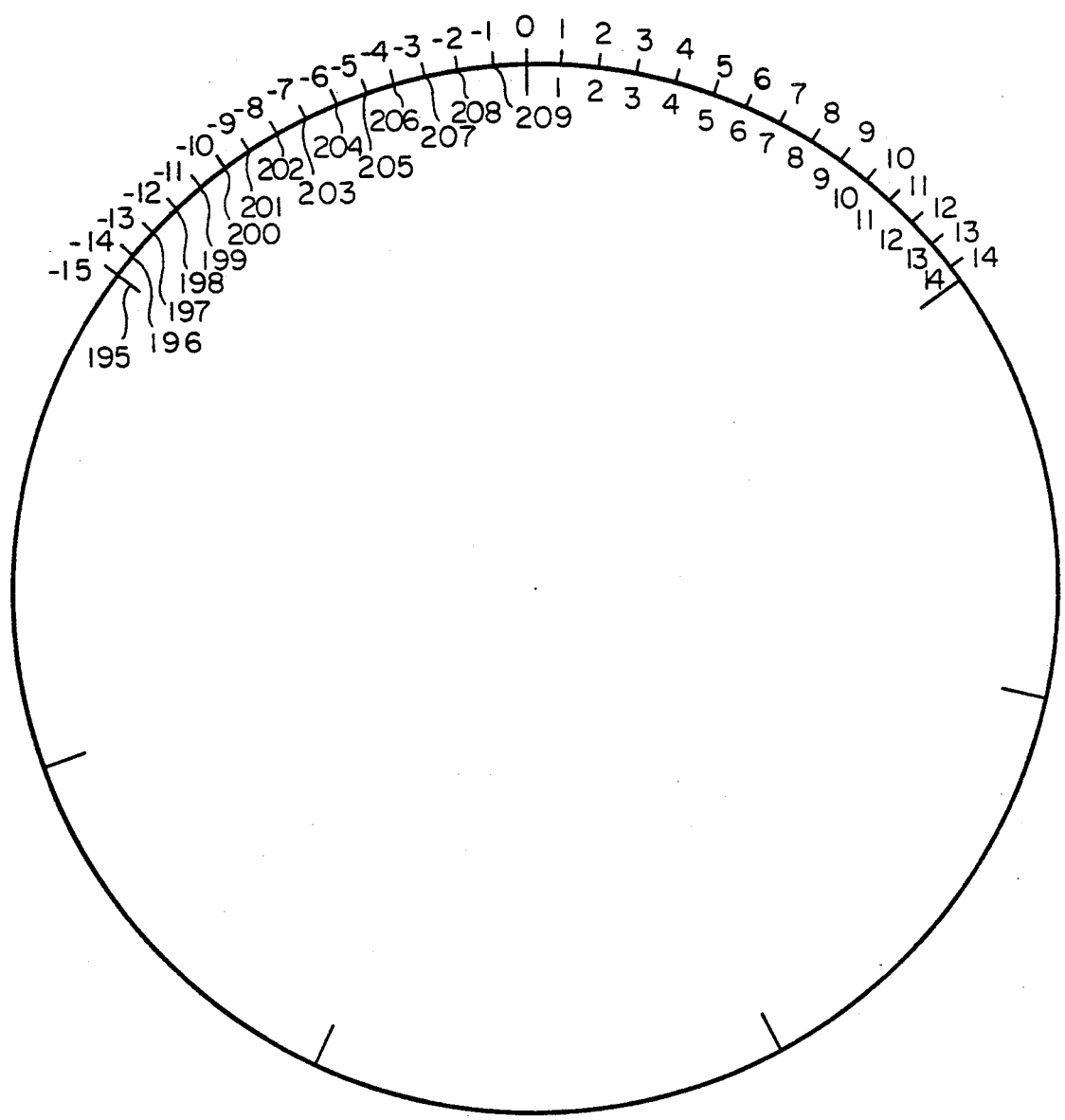
FIG. 15 illustrates an RNS ring representing positive and negative values.

The pipelined base extension processor illustrated in FIG. 12 could produce incorrect results if negative residue input numbers are used because the process carried out by the processor implicitly assumes that redundant mixed base digit $a_r$ is zero. For example, FIG. 15 illustrates a portion of a redundant ring with moduli of $m_1=3$, $m_2=5$, $m_3=2$, and $m_4=7$. FIG. 16 lists values corresponding to the FIG. 15 ring. As discussed above, the processor described with respect to FIG. 12 would calculate a redundant residue digit, $|X|_7$, of 5 if $X=19$ in the form of $r_1=1$, $r_2=4$, and $r_3=1$ were input to the processor. However, as illustrated by FIG. 8, $r_1=1$, $r_2=4$, and $r_3=1$ could represent $X=-11$. As illustrated in FIG. 15, $X=-11$ corresponds to a ring position of 199 and therefore $X=-11$ has a redundant residue digit of 199 mod 7 or 3. As this example illustrates, the processor of the first embodiment must have prior information of the sign of the input number to avoid errors in extending the base of a RNS.

Providing a signal indicating the sign of the input number, while feasible, would make a system employing the processor more complex, therefore it is desirable to design a base extension processor which does not require a sign signal.

One method of deriving a correct redundant residue digit is to determine what number must be entered into adder 32 of FIG. 12 to get the correct redundant residue digit. Either O or M mod $m_r$ ($m_r$ is the same as $m_4$ in the examples described above) must be entered into adder 32 to calculate a correct redundant residue digit. However, at the first stage of processing of FIG. 12 whether to enter O or M mod $m_r$ into adder 32 is not known. A determination of whether to enter O or M mode $m_r$ can only be made after $a_3$ is calculated by multiplier 43 since $a_3$ indicates the sign of a residue number, as discussed with respect to FIG. 8.

Figure 17:
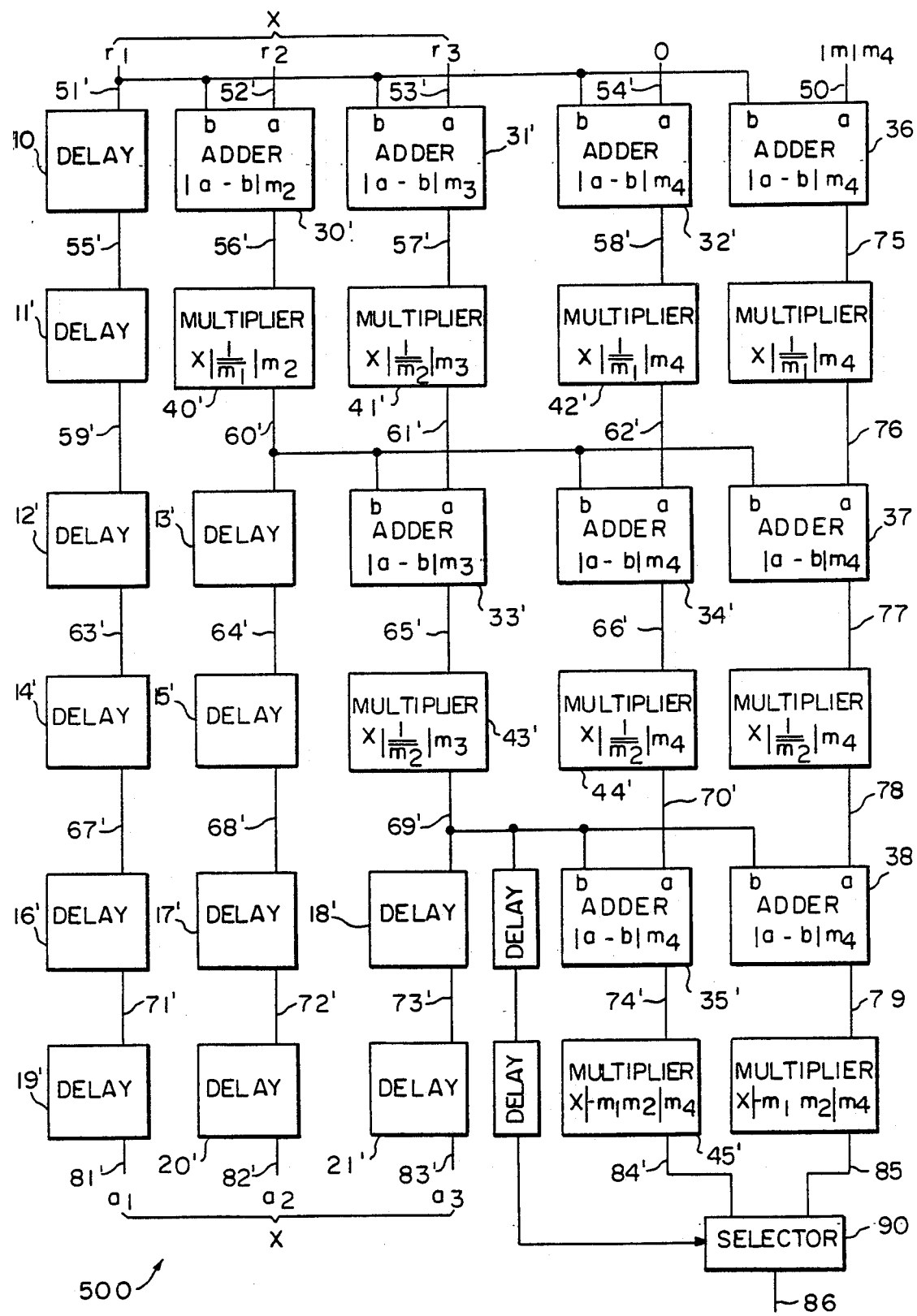
FIG. 17 illustrates a pipelined residue to mixed base converter and base extension processor according to a second preferred embodiment.

A duplicate channel can be added in parallel with the channel comprised of adders 32, 34, and 35 and multipliers 42, 44, and 45 as illustrated in FIG. 17 as converter/processor 500. In FIG. 17, primed numbers are used to designate components which are analogous to those described with respect to FIG. 12. This converter/processor 500 has M mod $m_r$ entered into a first stage adder 36. The converter/processor 500 carries out calculations using O and M mod $m_r$ respectively, and then value of $|X|m_4$ from the appropriate channel is selected by selector 90 based on the value of $a_3$.

Using a duplicate channel requires more hardware, therefore the process described below is preferable where hardware minimization is a paramount concern. As discussed above, if the residue input number is negative the following relationship holds:

$$a_r = m_r - 1 = |-1|m_r \tag{23}$$

For example, applying Equation (23) to $a_r$, or $a_4$, of step 14 of FIG. 10 results in:

$$\left| \frac{1}{3} \cdot \frac{1}{5} \cdot \frac{1}{2} X \right|_7 + \left| \frac{1}{2} \right|_7 2 = |-1|_7 \tag{24}$$

Which can be solved for $|X|_7$ as follows:

$$|X|_7 = |-3\cdot 5\cdot 2 + (-1)\cdot 3\cdot 5\cdot 2|_7 = |-60|_7 = 3 \tag{25}$$

A value of $|X|_7$ equal to 3 is the correct redundant residue digit for a negative input number X. The value of the left-hand side of Equation (24) is the output from the adder 35 of FIG. 12. In the special case of $m_N$ being equal to 2, $a_N$ is O for positive numbers and 1 for negative numbers. Thus, $a_N$ can be used as a factor to turn $|-1|m_r$ off for positive numbers or $|-1|m_r$ on for negative numbers in the computation of $a_r$ as expressed by the following equation:

$$a_r = a_N(m_r - 1) = |-a_N|m_r \tag{26}$$

Assuming $m_N$ ($m_N$ is $m_3$ in the examples described above) is 2, $a_N$ is 0 for positive numbers and 1 for negative numbers. Thus, $a_N$ can be used to determine $a_r$ according to the following equation:

$$a_r = a_N(m_r - 1) = |-a_N|m_r \tag{27}$$

As seen by inspection of Equation (27) when $a_N$ is 0, $a_r$ is 0 and when $a_N$ is 1, $a_r$ is $|-1|m_r$.

If S denotes the output from the N-th adder in the $m_r$ channel, then substitution of S into Equation (27) yields:

$$a_r = \left| \left| \frac{1}{M} X \right|_{m_r} + \left| \frac{1}{m_N} S \right|_{m_r} \right|_{m_r} = |-a_N|_{m_r} \quad (28)$$

If $m_N$ is used to denote $M/m_N$ then Equation (28) can be solved for $|X|_{m_r}$ as follows:

$$|X|_{m_r} = |-Ma_N - m_N S|_{m_r} \quad (29)$$

Figure 18:
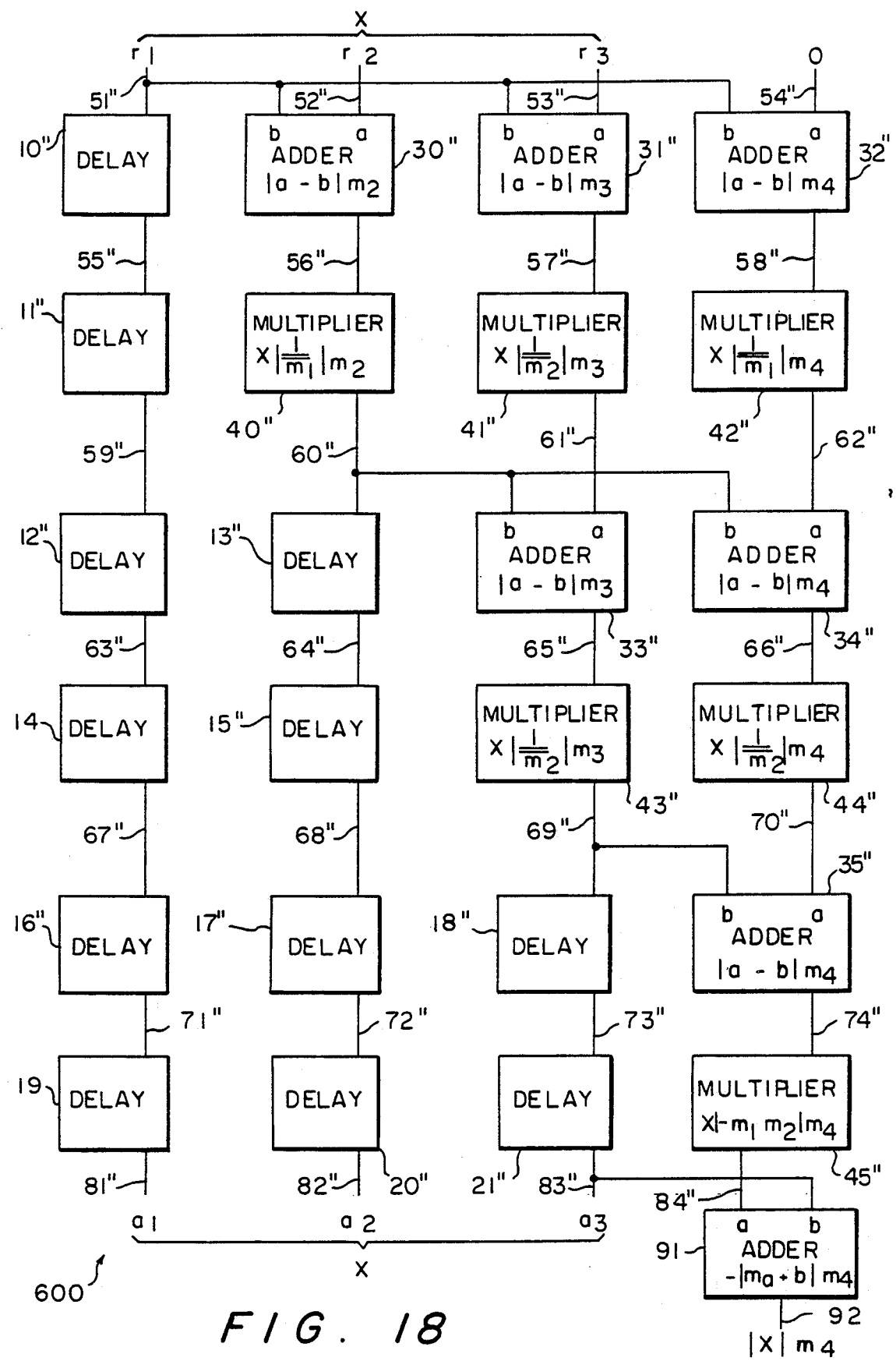
FIG. 18 illustrates a pipelined residue to mixed base converter and base extension processor according to a third preferred embodiment.

FIG. 18 illustrates a converter/processor which implements Equation 29 to calculate redundant residue digit $|X|_{m_4}$. The converter/processor 600 of FIG. 18 is similar to converter/processor 100 of FIG. 12 except for the addition of an adder 91 to implement the subtraction operation of Equation 29. The converter/processor requires one more processing stage than the converter/processor 100.

Equation (29) can be rearranged to produce the following equation:

$$|X|_{m_r} = | |-m_N|_{m_r} |m_N a_N + S|_{m_r} \quad (30)$$

If the a input to the N-th modulo $m_r$ adder (adder 35 in the embodiment described above) is denoted by $S'$ then the following equation holds:

$$S = S' - a_N \quad (31)$$

Applying Equation 31 to the sum inside Equation 30 as follows and recognizing that $m_N$ is 2 results in Equation 32:

$$\begin{aligned} m_N a_N + S &= m_N a_N + S' - a_N \\ &= (m_n - 1) a_N + S' \\ &= a_N + S' \end{aligned} \quad (32)$$

Applying Equation 32 to Equation (30) results in the following Equation:

$$|X|_{m_r} = | |-m_N|_{m_r} |a_N + S'|_{m_r} |_{m_r} \quad (33)$$

Figure 19:
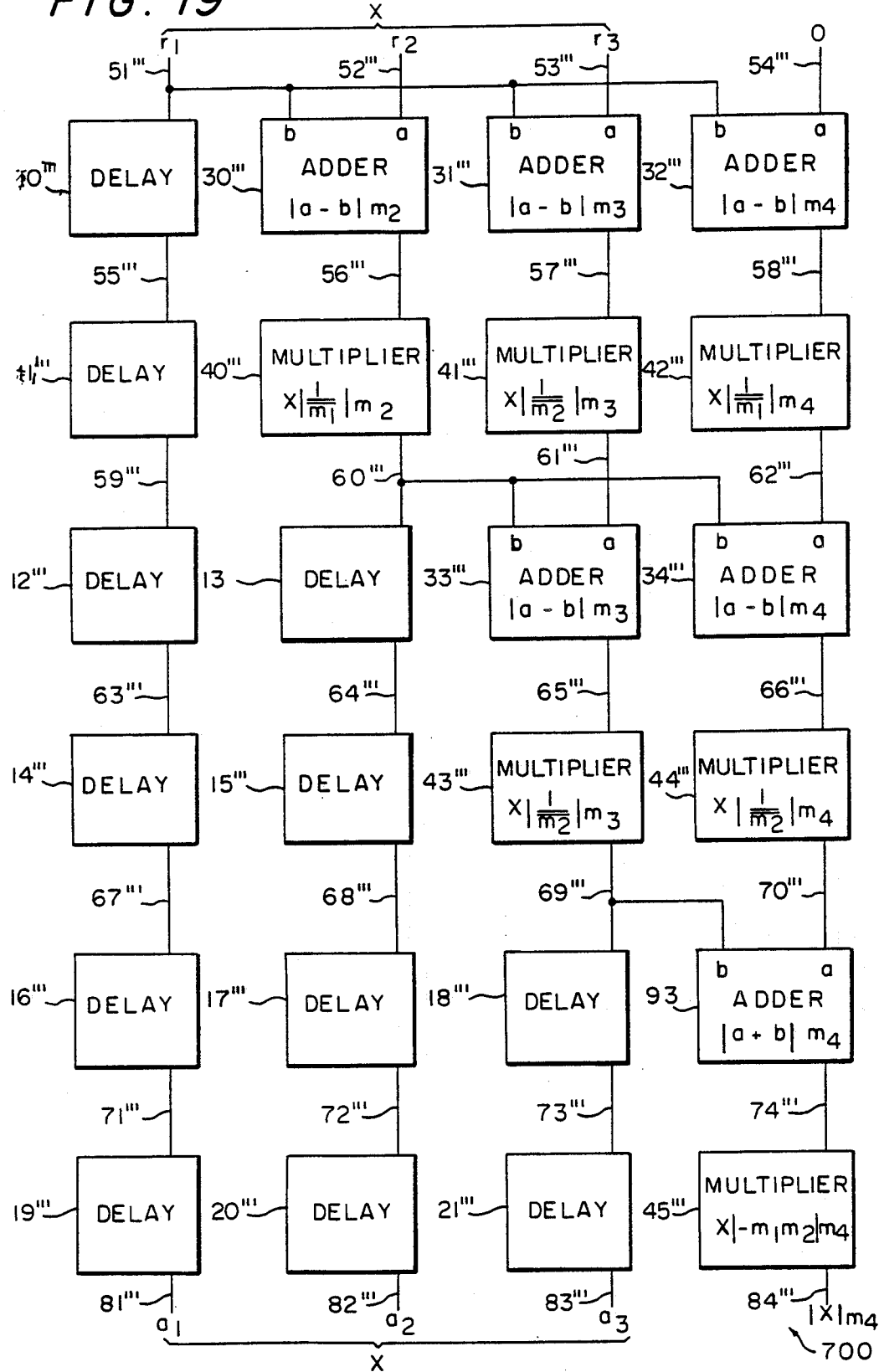
FIG. 19 illustrates a pipelined residue to mixed base converter and base extension processor according to a fourth preferred embodiment.

FIG. 19 illustrates a converter/processor 700 which implements Equation 33. The converter/ processor 700 illustrated in FIG. 19 is similar to the converter/processor 100 of FIG. 12 except that the adder 35 of converter/processor 100, which subtracts its b input from its a input, has been replaced with an adder 93, which adds its b input to its a input.

All of the base extension processors illustrated in FIGS. 17, 18, and 19 have the advantage of not requiring a priori knowledge of the sign of an input number.

Figure 20:
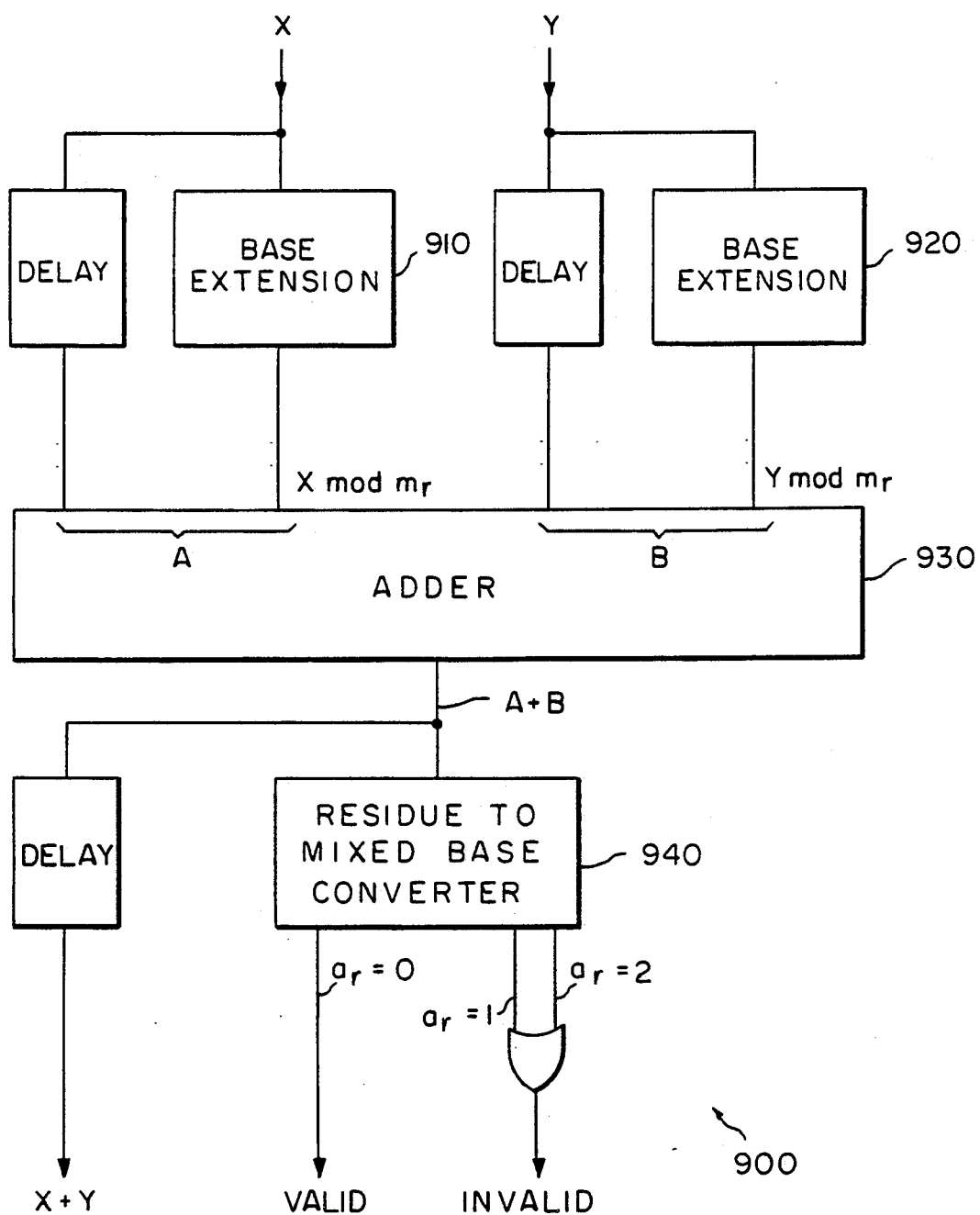
FIG. 20 illustrates a residue addition overflow detection processor which utilizes a residue to mixed base converter and base extension processors of the instant invention.

FIG. 20 illustrates a residue addition overflow detection processor which utilizes a residue to mixed base converter and base extension processor as described above. In FIG. 20 a residue addition overflow detection processor 900 adds a first non-redundant residue input number X and a second non-redundant residue input number Y. The overflow detection processor 900 includes a first base extension circuit 910 which receives the first non-redundant residue input number X and which generates a first redundant residue digit X mod $m_r$, and a second base extension circuit 920, parallel to the first base extension circuit 91?, which receives the second non-redundant residue input number Y and generates a second redundant residue digit Y mod $m_r$.

An adder 930 receives the first non-redundant residue input number X and the first redundant residue digit X mod $m_r$ as a first operand, and receives the second non-redundant residue input number Y and the second redundant residue digit Y mod $m_r$ as a second operand. The adder 930 adds the first operand to the second operand using modular addition to produce a sum in residue representation.

A residue to mixed base converter 940 receives the sum, converts the sum into mixed base representation, and outputs digits corresponding to the mixed base representation. If the redundant mixed base digit $a_r$ is zero then overflow has not occurred in the addition of the first non-redundant residue input number to the second non-redundant residue input number. If the redundant mixed base digit is not zero then overflow has occurred.

The foregoing description has been set forth merely to illustrate preferred embodiments of the invention and is not intended to be limiting. Since modification of the described embodiments incorporating the spirit and substance of the invention may occur to persons skilled in the art, the scope of the invention should be limited solely with respect to the appended claims and equivalents. For example, electrical signals can be used instead of optical signals depending on the particular application. Conversion and processing of an arbitrary number of input digits and an arbitrary number of redundant moduli can be implemented in accordance with the description above. The highest order modulus $m_N$ can be greater than two. For example, the embodiment illustrated in FIG. 17 can be used when $m_N = 5$ and when $m_N = 3$. FIGS. 21 and 22 list numerical values when $m_N = 5$ and when $m_N = 3$, respectively.

What is claimed is:

1. An information processor receiving a residue number as an input, said information processor comprising:
   a plurality of arithmetic units arranged in a plurality of sequentially arranged stages, odd stages of said plurality of stages performing first arithmetic operations in parallel, even stages of said plurality of stages performing second arithmetic operations in parallel;
   said odd and even stages alternately performing said first operations and said second operations to generate at least one mixed base digit corresponding to said residue number.

2. An information processor as set forth in claim 1, wherein said first operations are one of modular additions and modular subtractions, and said second operations are modular multiplications.

3. An information processor as set forth in claim 2, wherein said first and second operations are performed such that an equation in a general form of;

$$X = a_N \prod_{i=1}^{N-1} m_i + \ldots + a_3 m_1 m_2 + a_2 m_1 + a_1$$

is solved for at least one $a_k$, where $k = 1, \ldots N$.

4. An information processor as set forth in claim 3, further comprising at least one delay circuit arranged such that said information processor processes information in a synchronous pipelined manner.

5. An information processor as set forth in claim 4, wherein said plurality of arithmetic units and said at least one delay circuit are arranged in a plurality of non-redundant residue channels such that one channel is associated with each digit of said at least one mixed base digit.

6. An information processor as set forth in claim 5, wherein said arithmetic units are optical arithmetic units.

7. An information processor as set forth in claim 5, further comprising a first redundant residue channel arranged parallel to said nonredundant residue channels; said first redundant residue channel including arithmetic units which calculate a first redundant residue digit based on said residue number.

8. An information processor as set forth in claim 7, wherein said arithmetic units are optical arithmetic units.

9. An information processor as set forth in claim 7, wherein an N-th arithmetic unit performing first operations in said first redundant residue channel adds $a_N$ to a sum $S'$, said sum $S'$ generated from stages prior to said N-th arithmetic unit performing first operations, where $a_N$ is a highest order non-redundant mixed base digit and N is a positive integer.

10. An information processor as set forth in claim 7, wherein:
a first arithmetic unit of said first redundant residue channel utilizes an input of zero; and wherein said information processor further comprises;
a second redundant residue channel arranged parallel to said first redundant residue channel, said second redundant residue channel including arithmetic units to calculate a second redundant residue digit based on said residue number, said second redundant residue channel utilizing an input of $|M|m_r$, where M is a product of non-redundant moduli and $m_r$ is a redundant modulus; and
a selector selecting said first or second redundant residue digits based on a value of a highest order non-redundant mixed base digit.

11. An information processor as set forth in claim 7, further comprising a final stage arithmetic unit adding $M-a_N$ to a value received from a last arithmetic unit of said first redundant residue channel, where M is a product of non-redundant moduli and $a_N$ is a highest order non-redundant mixed base digit.

12. A method of processing a residue input number signal to generate a mixed base digits signal corresponding to said residue input number signal, comprising the steps of:
(a) receiving said residue input number signal;
(b) subtracting a first digit signal of said residue input number signal from other digit signals of said residue input number signal to generate first stage signals, said first digit signal indicative of a first mixed base digit;
(c) in parallel with step (b), time delaying a signal identical to said first digit signal;
(d) multiplying each of said first stage signals by multiplicative inverse signals to produce a second mixed base digit signal indicative of a second mixed base digit;
(e) in parallel with step (d), time delaying said signal identical to said first digit signal.

13. A method according to claim 12, further comprising the steps of:

(f) repeatedly subtracting mixed base digit signals and multiplying by multiplicative inverse signals in a synchronous pipelined fashion such that additional mixed base digit signals are generated.

14. A method according to claim 13, further comprising these steps performed in synchronism with steps (a) through (f):
(g) subtracting said first digit signal of said residue input number signal from a zero signal;
(h) repeatedly subtracting mixed base digit signals and multiplying by multiplicative inverse signals in a synchronous pipelined fashion such that a first sum signal, is generated;
(i) subtracting a highest order mixed base digit signal from said first sum signal to produce a second signal; and
(j) multiplying said second signal by a first multiplier signal to produce a first redundant residue digit signal associated with said residue input number signal, said first redundant residue digit signal representing a correct redundant residue digit when said residue input number signal represents a non-negative number.

15. A method according to claim 13 further comprising these steps performed in synchronism with steps (a) through (f):
(k) subtracting said first digit signal of said residue input number signal from a zero signal;
(l) repeatedly subtracting mixed base digit signals and multiplying by multiplicative inverse signals in a synchronous pipelined fashion such that a first sum signal is generated;
(m) adding a highest order mixed base digit signal to said first sum signal to produce a second signal; and
(n) multiplying said second signal by a multiplier signal to produce a first redundant residue digit signal associated with said residue input number signal, said first redundant residue digit signal representing a correct redundant residue digit when said residue input number signal represents a negative number and when said residue input number signal represents a non-negative number.

16. A method according to claim 14, further comprising these steps (o) thorough (r) performed in synchronism with steps (a) through (f) and steps (g) through (j):
(o) subtracting said first digit signal of said residue input number signal from a signal representing a number based on a non-redundant ring circumference;
(p) repeatedly subtracting mixed base digit signals and multiplying by multiplicative inverse signals in a synchronous pipelined fashion such that a third sum signal is generated;
(q) subtracting a highest order mixed base digit signal from said third sum signal to produce a fourth signal;
(r) multiplying said fourth signal by a second multiplier signal to produce a second redundant residue digit signal associated with said residue input number signal;
(s) after completion of steps (a) through (r), selecting one of said first redundant residue digit signal and said second redundant residue digit signal based on a highest order mixed base digit signal to produce a fifth signal, said fifth signal representing a correct redundant residue digit when said residue input number signal represents a negative number and when said residue input number signal represents a non-negative number.

17. A method according to claim 14, further comprising the step of:
(t) after steps (a) through (j), adding a signal representing $M \cdot a_N$ to said first redundant residue digit signal, where M is a product of nonredundant moduli and $a_N$ is a highest order mixed base digit, to produce a sixth signal, said sixth signal representing a correct redundant residue digit when said residue input number signal represents a negative number and when said residue input number signal represents a non-negative number.

18. An information processor receiving a residue number as an input, said information processor comprising:
a plurality of optical arithmetic and logic units (OALUs) arranged in channels and stages, each digit of said residue number corresponding to a channel which produces a mixed base digit associated with said residue number; said stages serially arranged to successively generate mixed base digits corresponding to said residue number by performing modular multiplication and modular subtraction; and
delay circuits arranged parallel to said plurality of OALUs such that all of said mixed base digits are transmitted from said information processor at essentially the same time.

19. An information processor as set forth in claim 18, wherein said modular multiplication and modular subtraction is performed to solve an equation in the general form of;

$$X = a_N \prod_{i=1}^{N-1} m_i + \ldots + a_3 m_1 m_2 + a_2 m_1 + a_1$$

for each $a_j$, $J=1, \ldots N$, where $a_j$ is a mixed base digit corresponding to said residue number, and $m_i$ are moduli of a residue number system.

20. An information processor as set forth in claim 19, further comprising at least one additional channel of OALUs for calculating a redundant residue digit, which corresponds to said residue number, based on said mixed base digits.

* * * * *